(12) United States Patent
Iida et al.

(10) Patent No.: US 6,541,298 B2
(45) Date of Patent: Apr. 1, 2003

(54) METHOD OF MAKING INFRARED SENSOR WITH A THERMOELECTRIC CONVERTING PORTION

(75) Inventors: Yoshinori Iida, Minato-ku (JP); Keitaro Shigenaka, Minato-ku (JP); Naoya Mashio, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 09/964,696

(22) Filed: Sep. 28, 2001

(65) Prior Publication Data
US 2002/0039838 A1 Apr. 4, 2002

(30) Foreign Application Priority Data
Sep. 29, 2000 (JP) .................................. 2000-298277

(51) Int. Cl.⁷ .............................................. H01L 21/00
(52) U.S. Cl. ........................ 438/54; 438/74; 438/280
(58) Field of Search ............................... 438/54, 57, 73, 438/74, 80, 280

(56) References Cited

U.S. PATENT DOCUMENTS

| | | | |
|---|---|---|---|
| 5,059,543 A | * 10/1991 | Wise et al. | 438/54 |
| 6,163,061 A | 12/2000 | Iida | 257/467 |
| 6,194,312 B1 | * 2/2001 | Chiba | 438/73 |
| 6,305,840 B1 | * 10/2001 | Kim et al. | 438/54 |
| 6,329,217 B1 | * 12/2001 | Watanabe et al. | 438/54 |

* cited by examiner

Primary Examiner—Chandra Chaudhari
(74) Attorney, Agent, or Firm—Oblon, Spivak, McClelland, Maier & Neustadt, P.C.

(57) ABSTRACT

An infrared sensor including a substrate, a plurality of infrared detection pixels arrayed on a substrate with each of the infrared detection pixels including an infrared absorption portion formed over the substrate and configured to absorb infrared radiation, a thermoelectric converter portion formed over the substrate and configured to convert a temperature change in the infrared absorption portion into an electrical signal, and support structures configured to support the thermoelectric converter portion and the infrared absorption portion over the substrate via a separation space, the support structures having conductive interconnect layers configured to deliver the electrical signal from the thermoelectric converter portion to the substrate. The infrared sensor further includes a pixel selection circuit configured to select at least one of the infrared detection pixels which delivers the electrical signal and an output circuit configured to output the electrical signal delivered from selected infrared detection pixels via the conductive interconnect layers. The conductive interconnect layers include a material the same as a material of gate layers of the MOS transistors, and have a thickness similar to the gate layers.

8 Claims, 21 Drawing Sheets

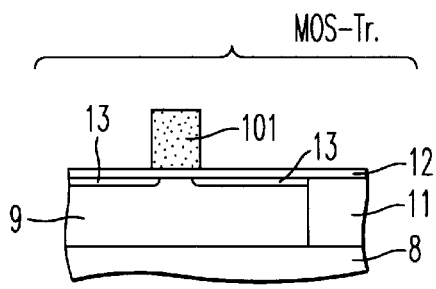
*FIG. 4A(1)*   *FIG. 4A(2)*
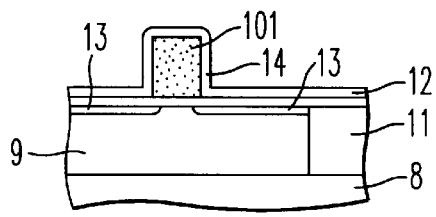
*FIG. 4B(1)*   *FIG. 4B(2)*
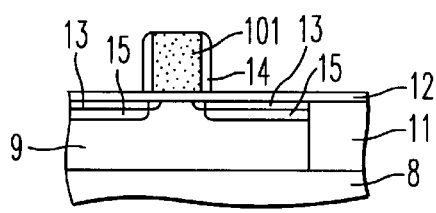
*FIG. 4C(1)*   *FIG. 4C(2)*
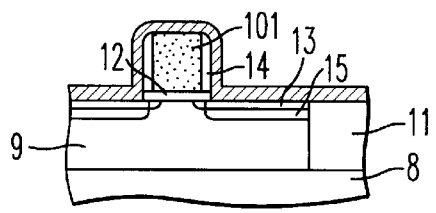
*FIG. 4D(1)*   *FIG. 4D(2)*
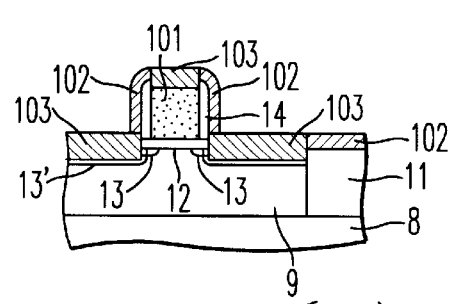
*FIG. 4E(1)*   *FIG. 4E(2)*

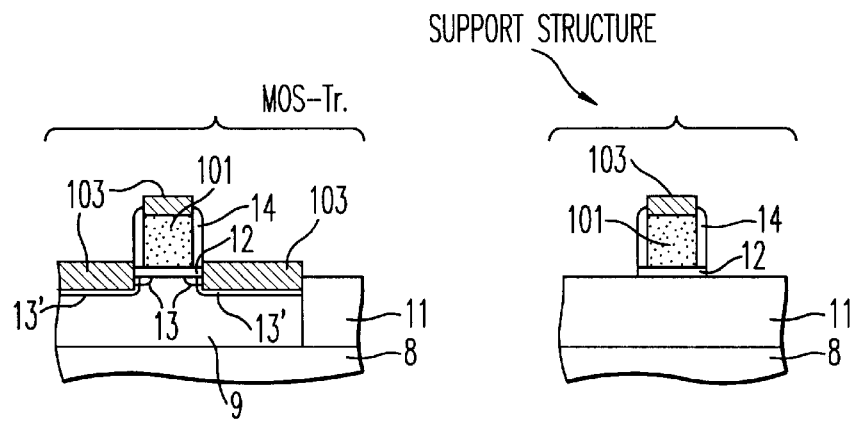
FIG.5F(1)    FIG.5F(2)
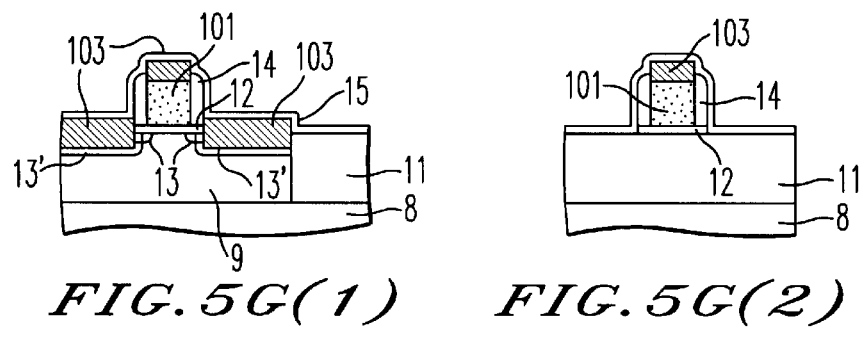
FIG.5G(1)    FIG.5G(2)
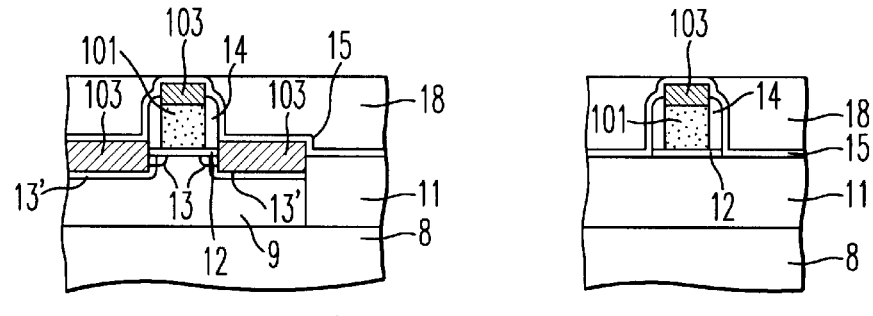
FIG.5H(1)    FIG.5H(2)
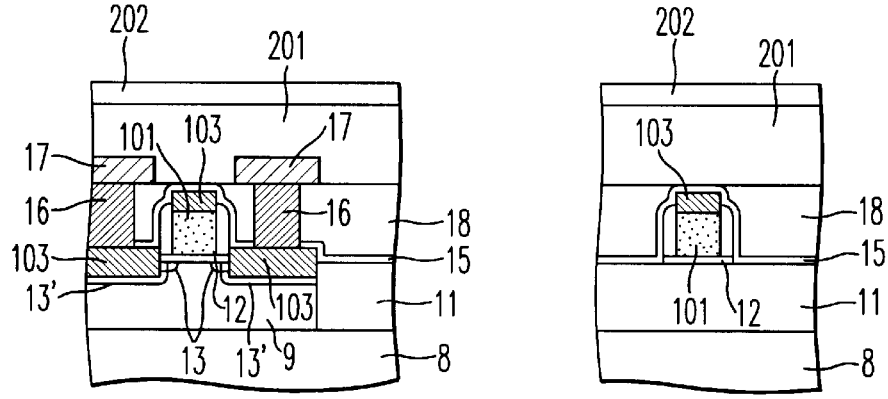
FIG.5I(1)    FIG.5I(2)

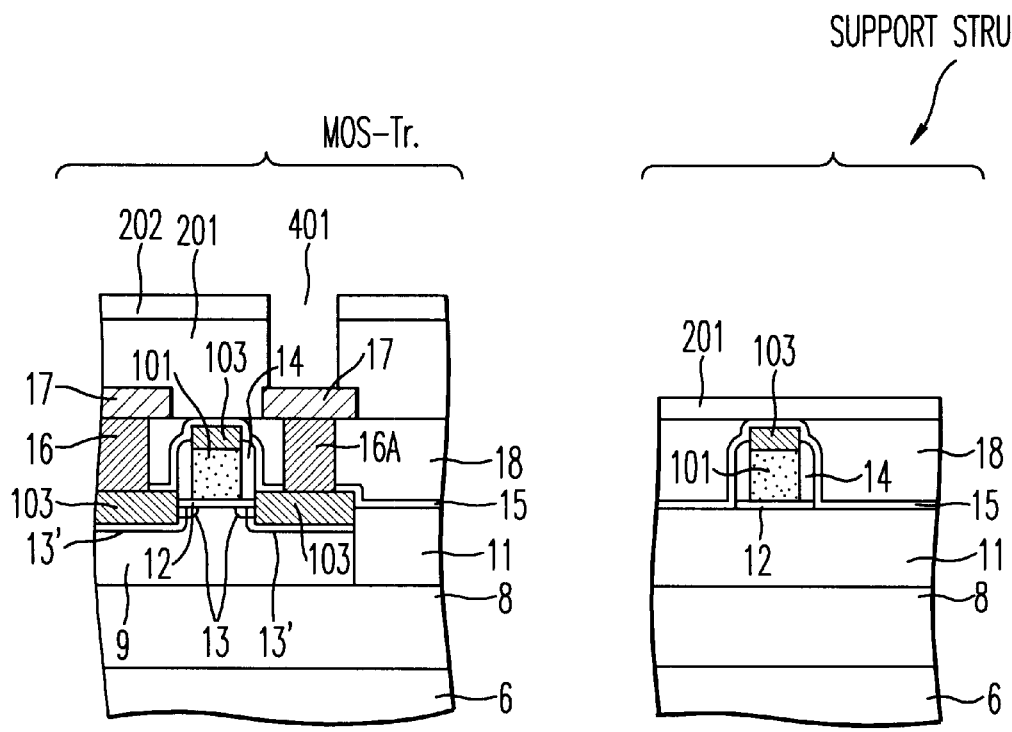
FIG. 7A(1)    FIG. 7A(2)
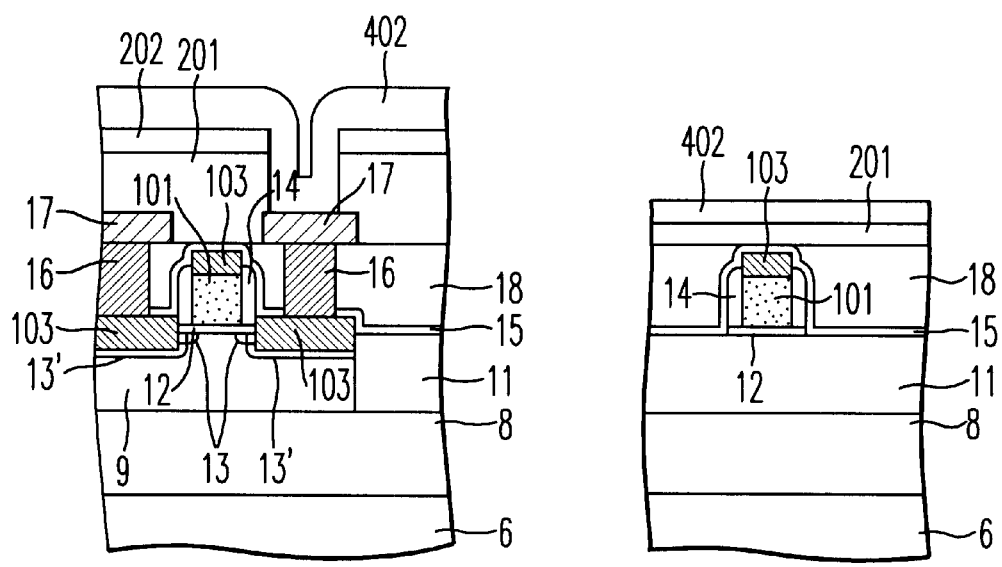
FIG. 7B(1)    FIG. 7B(2)

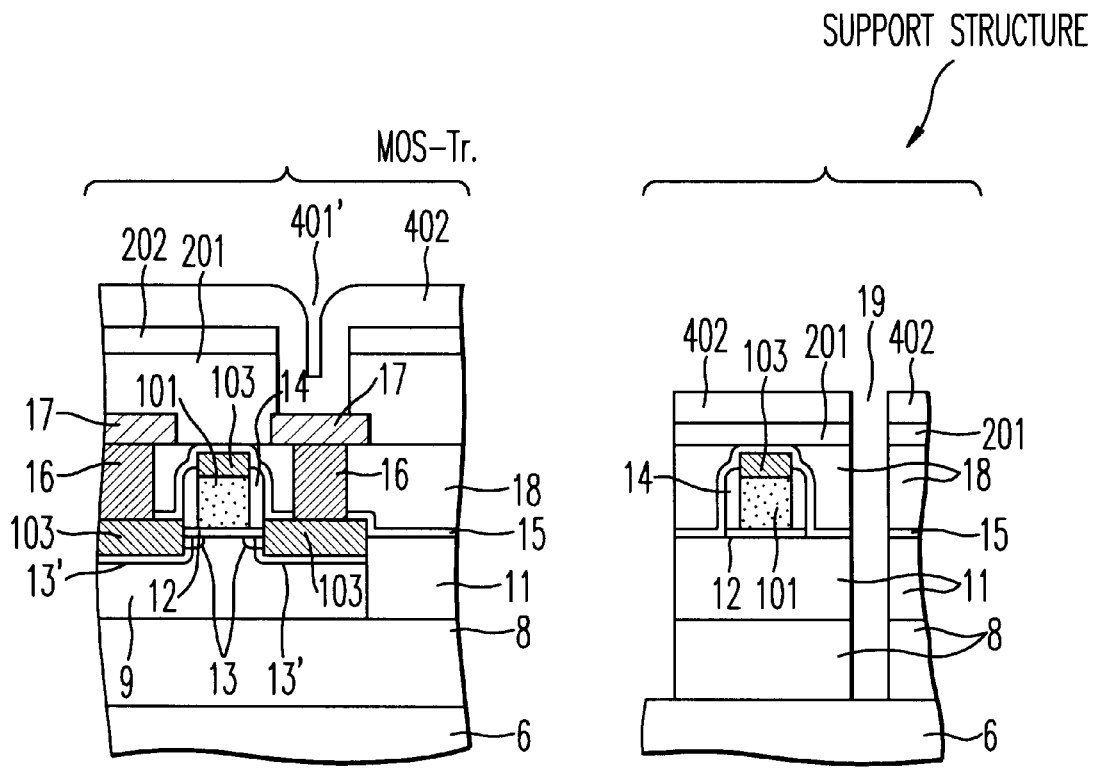
FIG.8C(1)   FIG.8C(2)
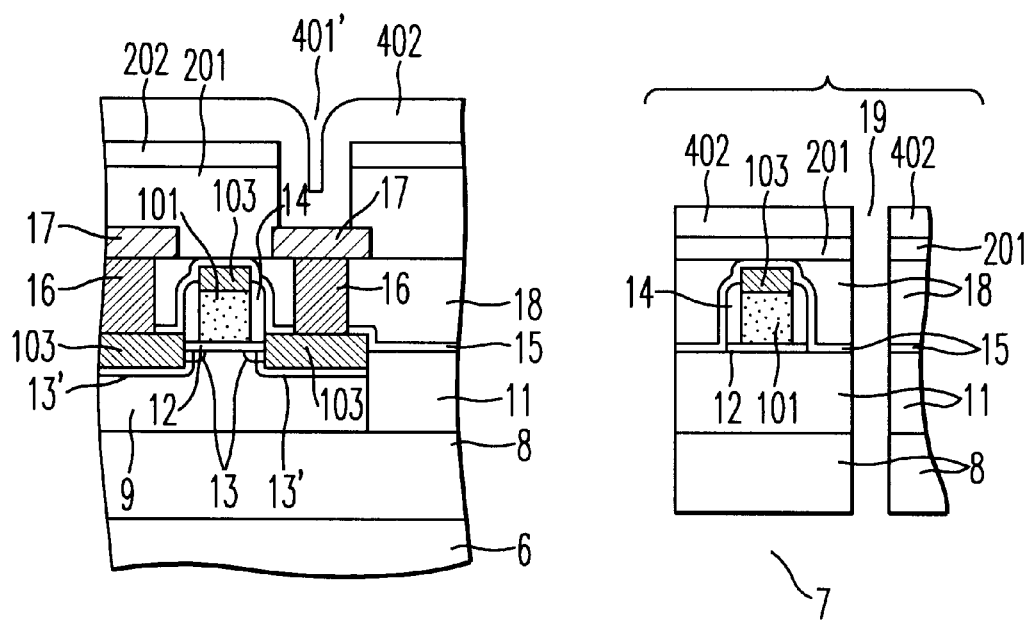
FIG.8D(1)   FIG.8D(2)

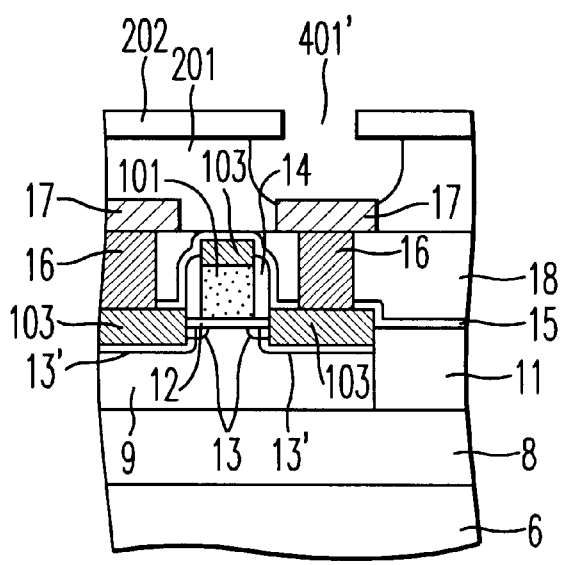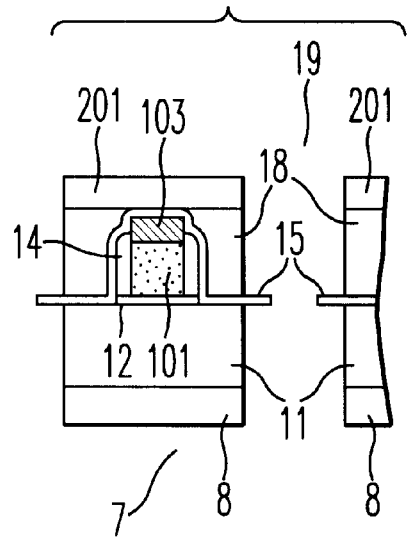
*FIG. 9E(1)*  *FIG. 9E(2)*
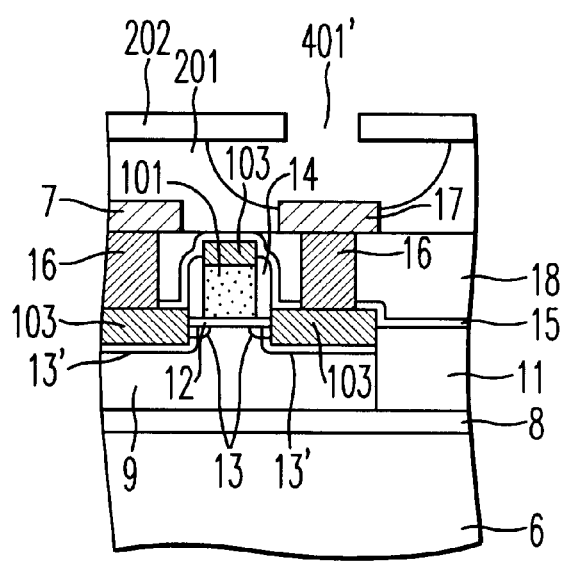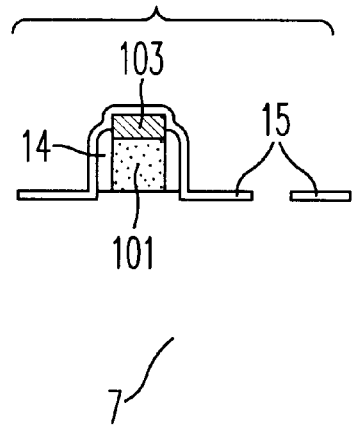
*FIG. 9F(1)*  *FIG. 9F(2)*

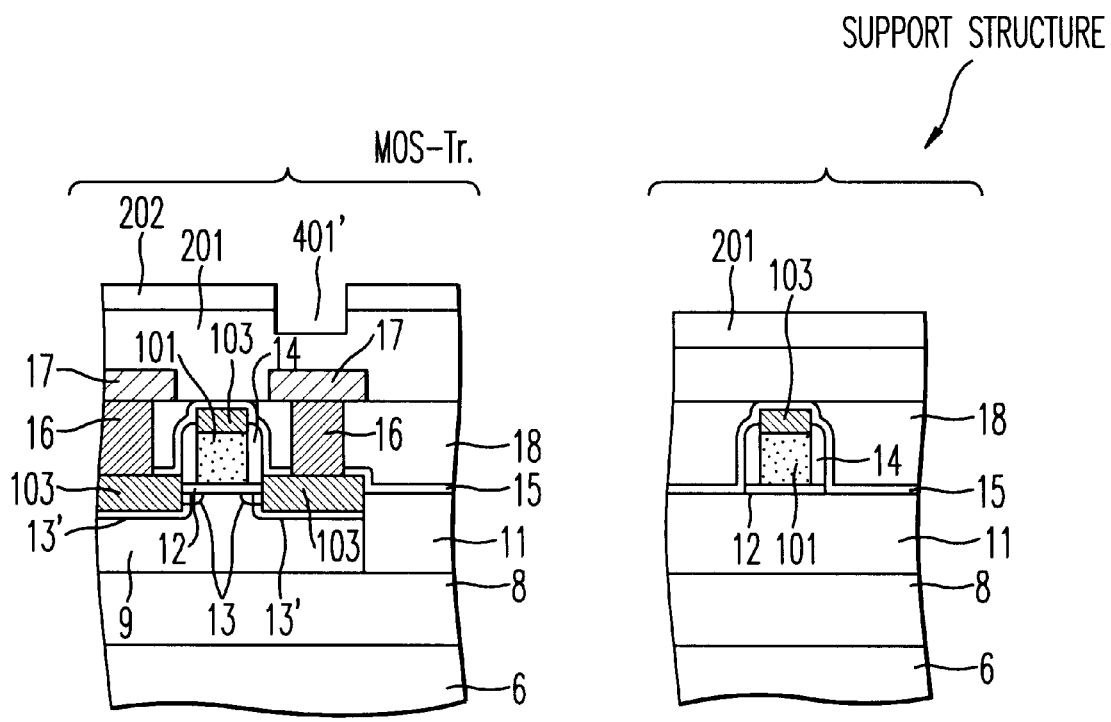
FIG. 11A(1)  FIG. 11A(2)
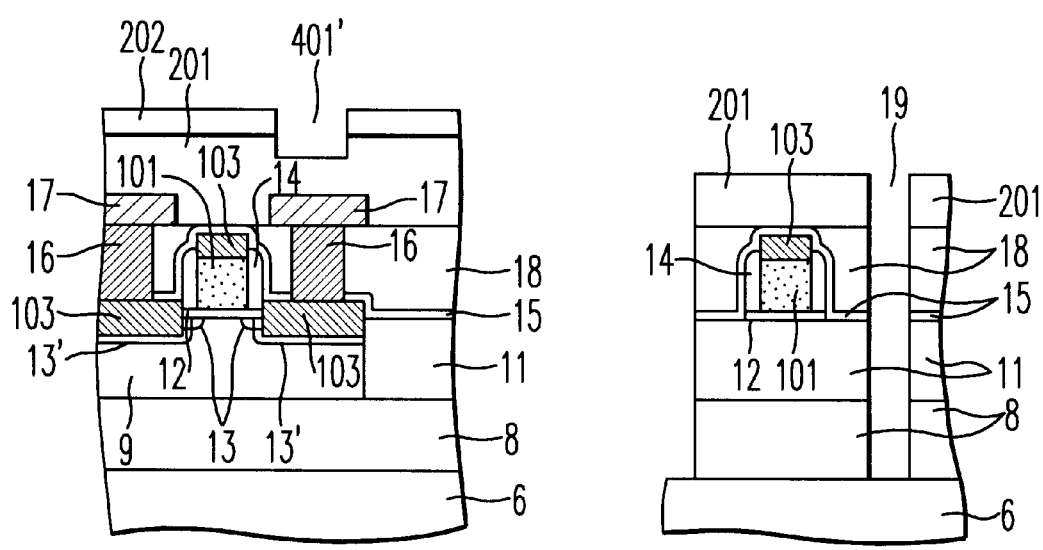
FIG. 11B(1)  FIG. 11B(2)

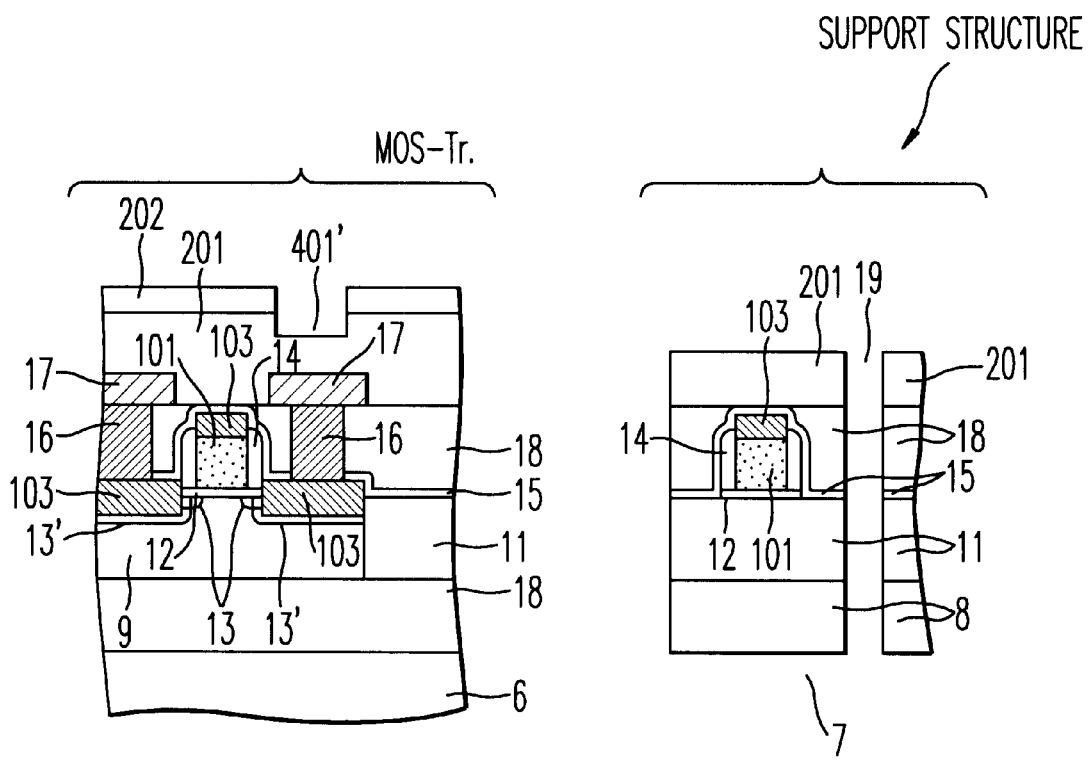
FIG. 12C(1)   FIG. 12C(2)
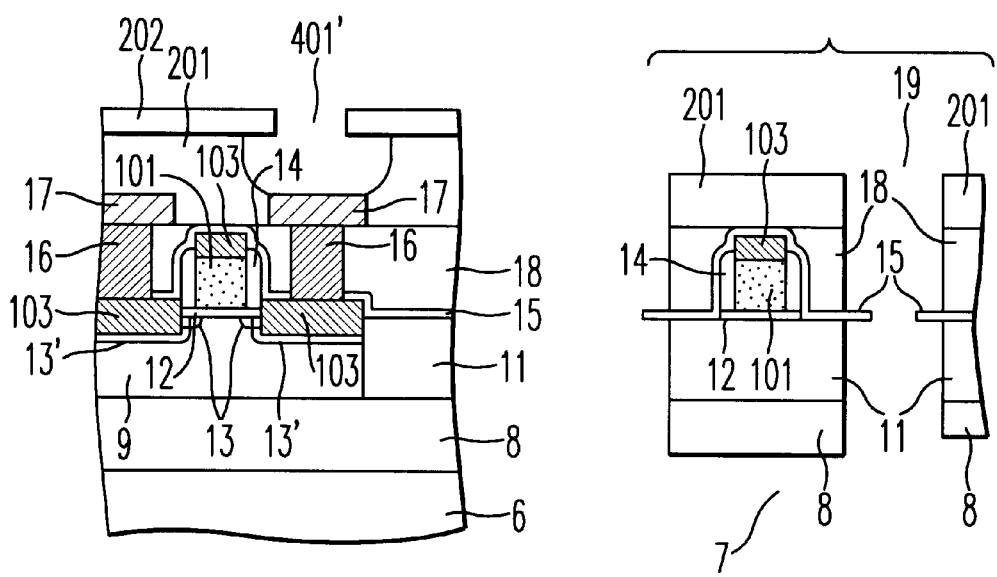
FIG. 12D(1)   FIG. 12D(2)

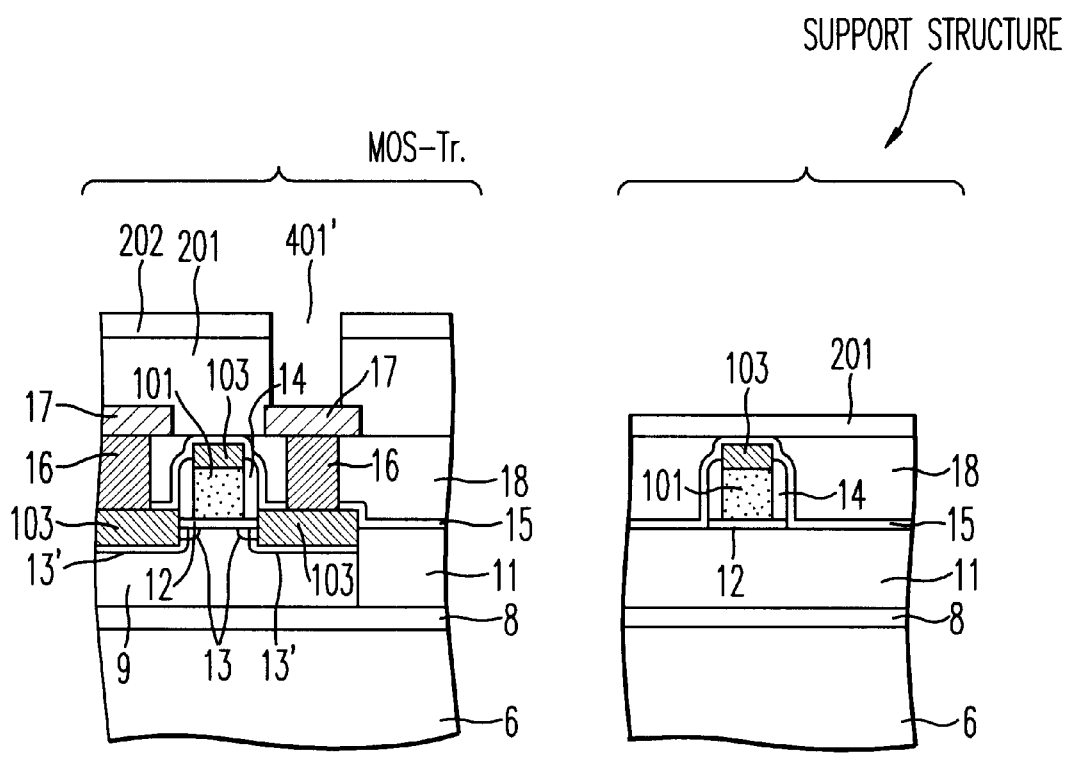
FIG. 16A(1)     FIG. 16A(2)
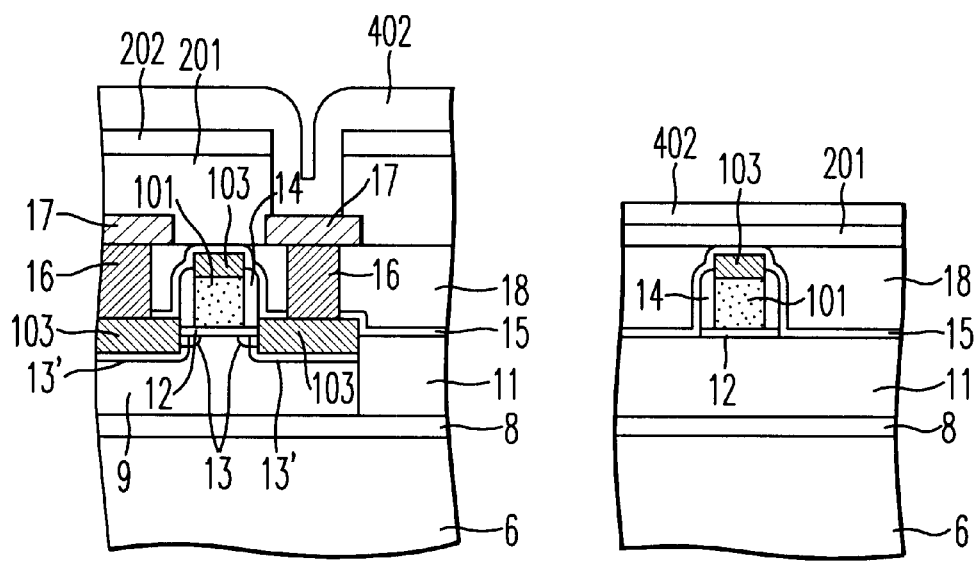
FIG. 16B(1)     FIG. 16B(2)

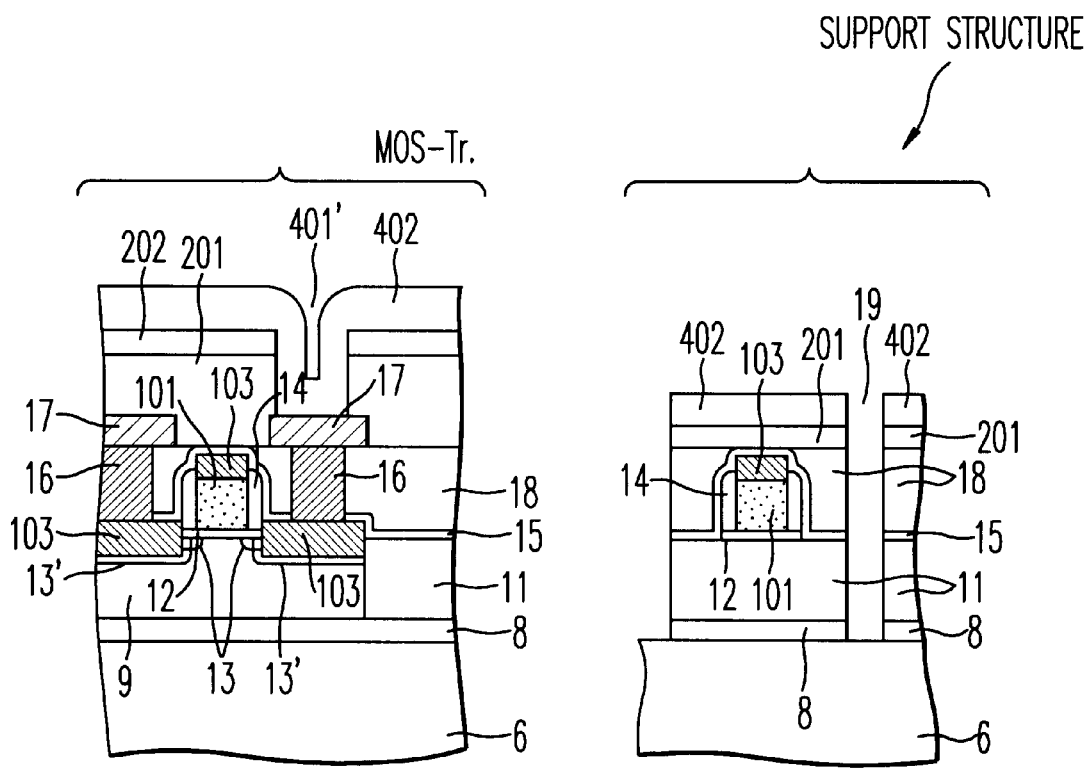
FIG. 17C(1)   FIG. 17C(2)
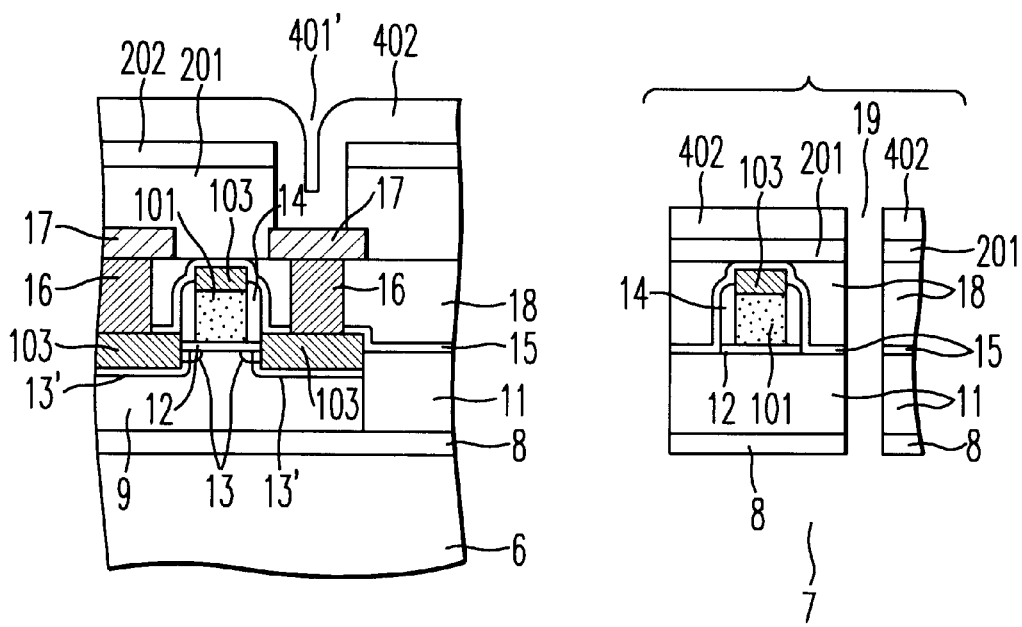
FIG. 17D(1)   FIG. 17D(2)

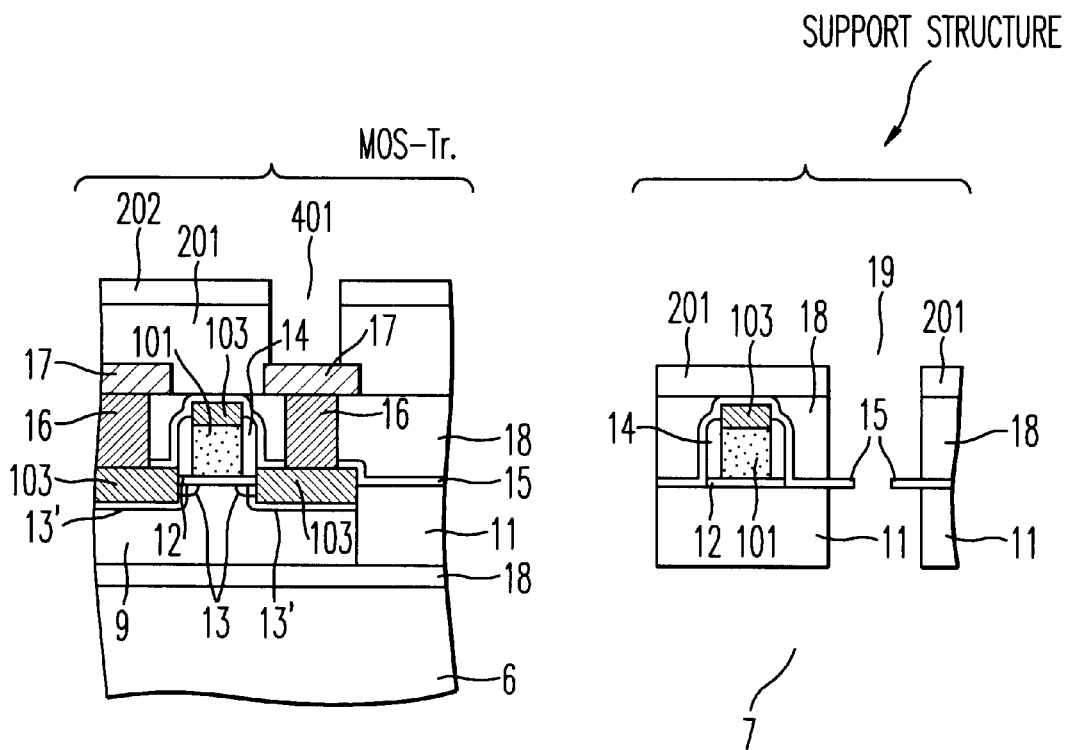
FIG. 18E(1)   FIG. 18E(2)
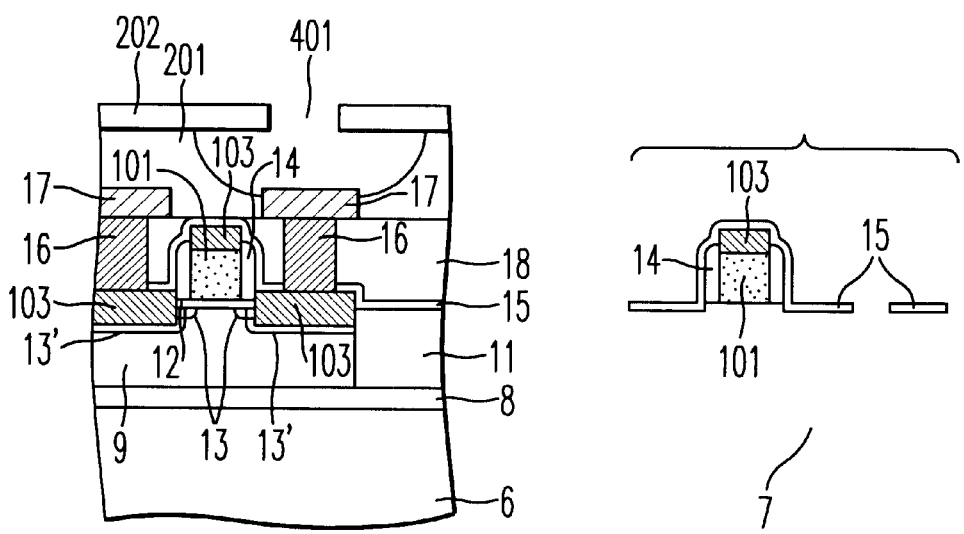
FIG. 18F(1)   FIG. 18F(2)

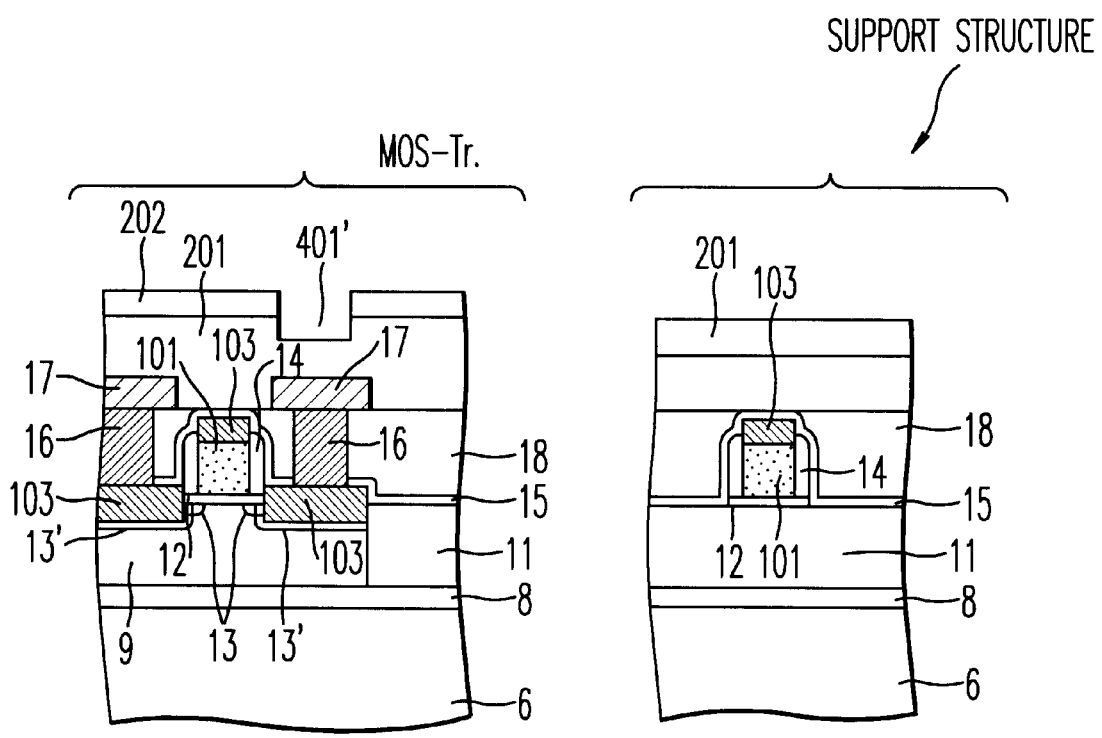
FIG. 19A(1)   FIG. 19A(2)
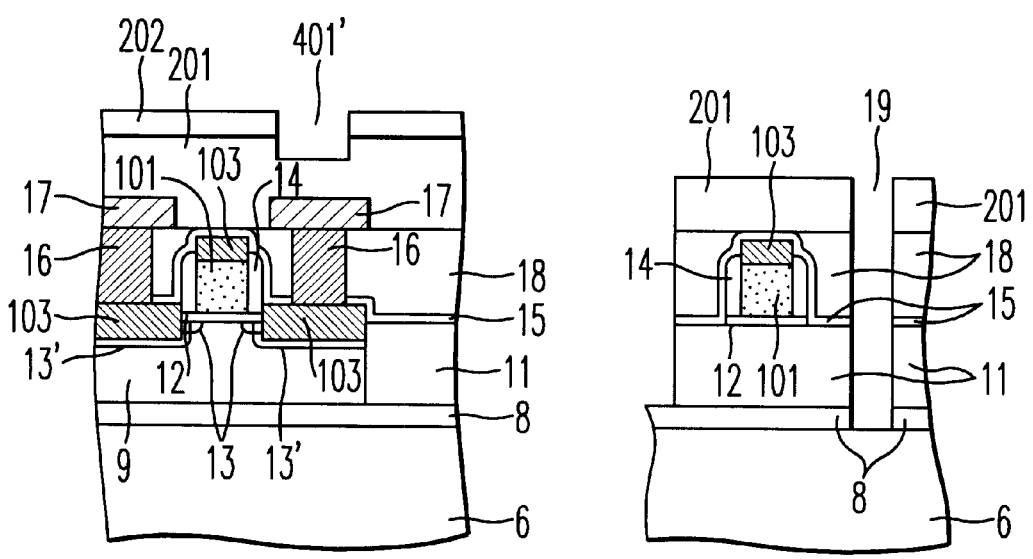
FIG. 19B(1)   FIG. 19B(2)

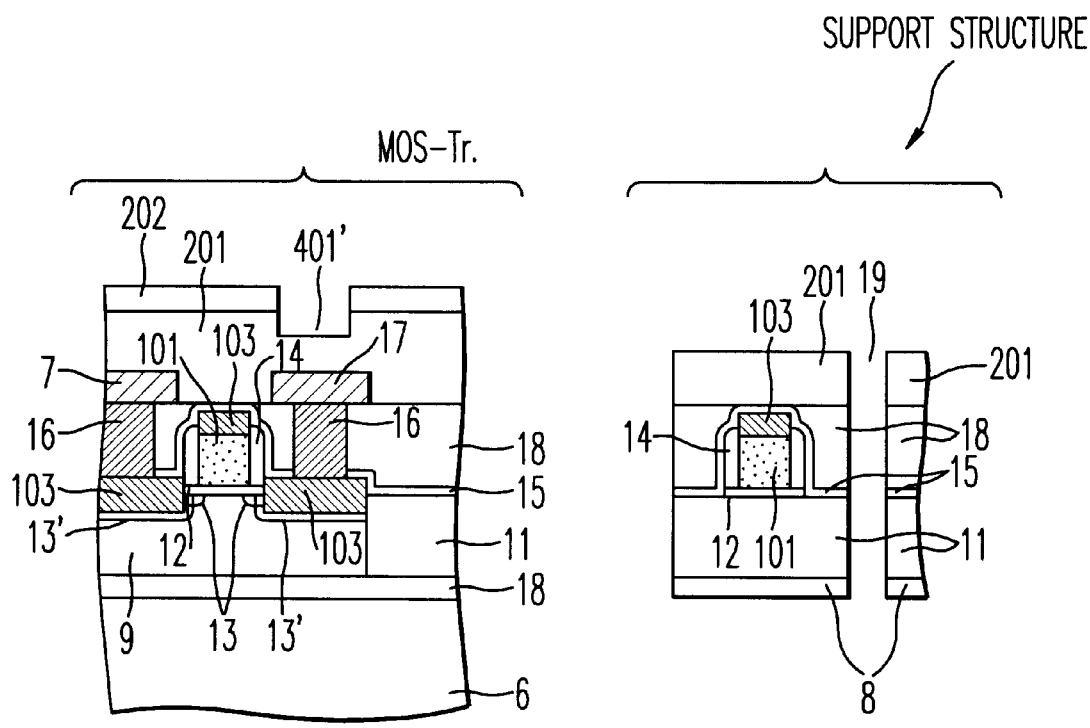
*FIG.20C(1)*   *FIG.20C(2)*
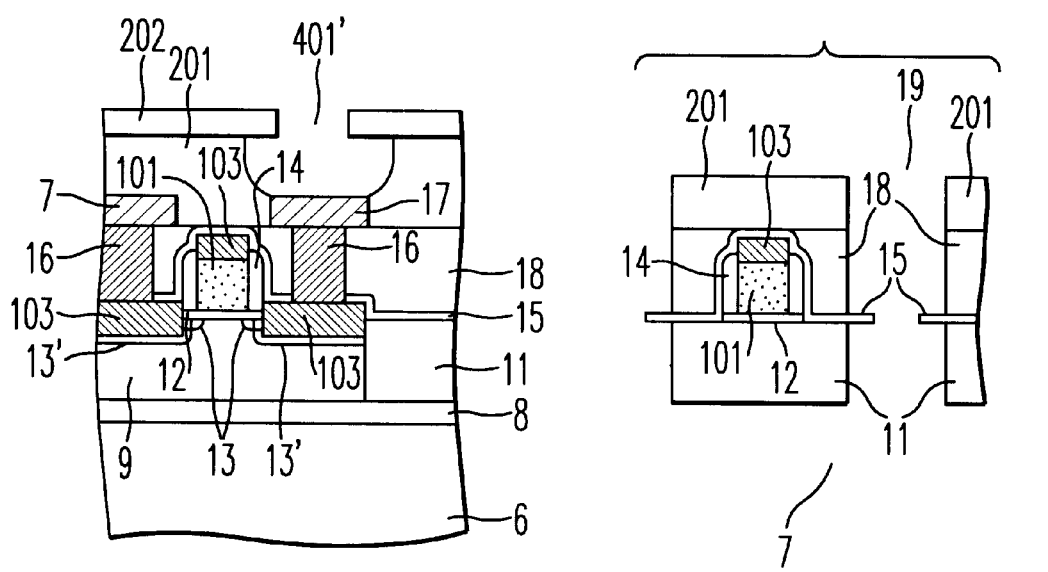
*FIG.20D(1)*   *FIG.20D(2)*

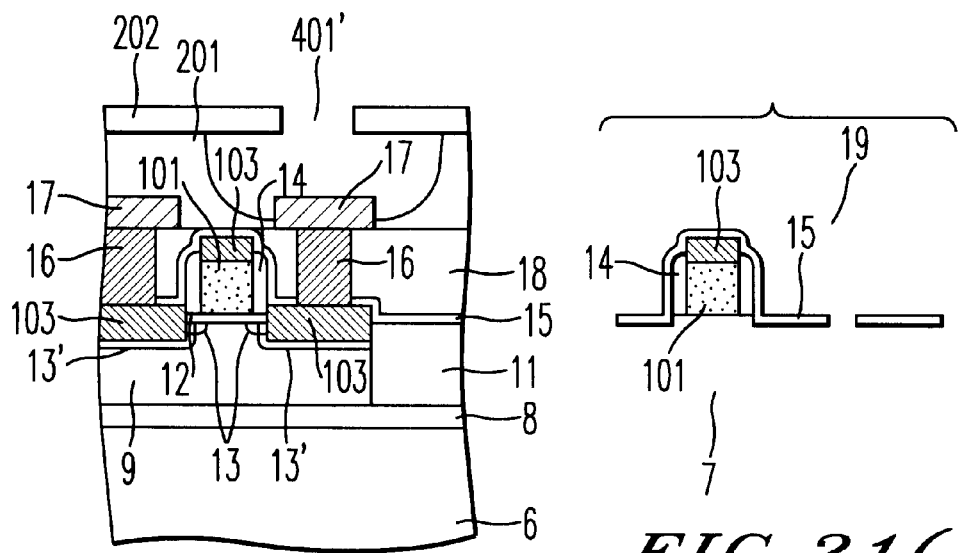
FIG.21(1)
FIG.21(2)
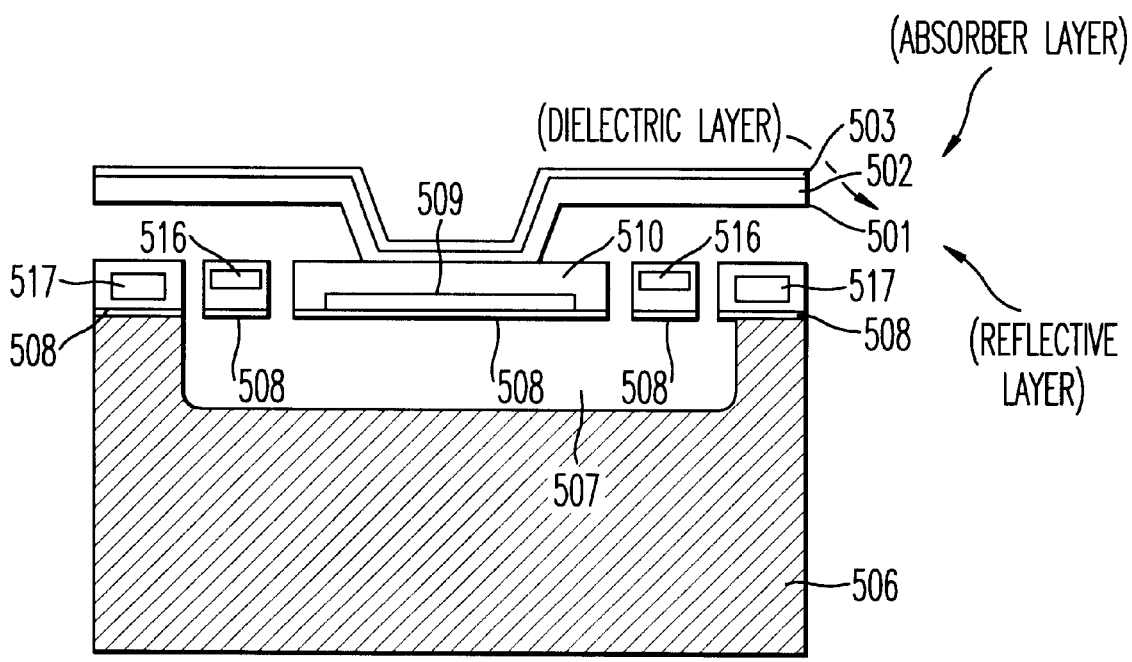
FIG.22

METHOD OF MAKING INFRARED SENSOR WITH A THERMOELECTRIC CONVERTING PORTION

CROSS-REFERENCE TO RELATED APPLICATIONS

This patent application claims benefit of and priority to Jap. Pat. Application No. P2000-298277 filed Sep. 29, 2000; the entire contents of which are incorporated herein by reference.

BACKGROUND OF THE INVENTION

1. Field of the Invention

The present invention relates to an infrared sensor and method of fabricating it and, more particularly, to a low-cost, high-sensitivity, uncooled infrared sensor and method of fabricating it.

2. Description of the Related Art

Infrared imaging makes it possible to image objects night and day. Also, infrared radiation has a feature that it has higher permeability into smoke and fog than visible light. In addition, infrared imaging can obtain information about the temperature of the subject. Therefore, infrared imaging finds extensive use as monitor cameras and fire detection cameras, as well as use in military defense applications.

Quantum-type solid-state infrared imagers as mainstream devices have a drawback that they must be operated at cryogenic temperatures and thus a cooling mechanism is necessary. In recent years, uncooled solid-state infrared imaging devices free of this drawback have been developed rigorously. In the uncooled, i.e., thermal type, solid-state infrared imager, incident infrared radiation having a wavelength of about 10 μm is converted into heat by an absorption mechanism. This heat causes a change in the temperature of the heat-sensitive portion. This temperature change is converted into an electrical signal by a thermoelectric conversion, and the electrical signal is read out. In this way, infrared image information is obtained.

Methods for improving the sensitivity of such an uncooled infrared sensor are classified into the following three major categories.

One method for improving the sensitivity is to improve the ratio of the infrared power, dP, incident on the infrared detection portion to the variation, dTs, of the temperature of the target, i.e., dP/dTs. In this method, the sensitivity improvement is mainly achieved by optics. That is, an infrared lens having a larger diameter is used. An antireflective film is coated. A low-absorption lens material is used. The infrared absorptivity of the infrared detection portion is improved. The infrared absorption area is increased. As uncooled infrared sensors have been equipped with an increasing number of pixels in recent years, most unit cells have come to use a size of approximately 40 μm×40 μm. Of the aforementioned items, improvement of the IR absorption area of the infrared detection portion remains a relatively important issue. However, it was reported that the IR absorption area has been successfully improved up to about 90% of the pixel area by forming an IR absorption layer on top of the pixels (Tomohiro Ishikawa, et al., Proc. SPIE Vol. 3698, p. 556, 1999). It will be difficult to achieve a higher sensitivity improvement by optical improvements.

Another method for improving the sensitivity is to improve the ratio of the variation, $dT_d$, of the temperature of the infrared detection portion to the power, dP, of the incident infrared radiation, i.e., $dT_d/dP$. This method is a thermal method, while the method previously described is an optical procedure. Generally, in an uncooled infrared sensor mounted in a vacuum package, heat conduction via support structures for supporting the infrared detection portion above a hollow structure inside the support substrate is currently prevalent in the transportation of heat from the infrared detection portion to the support substrate. Accordingly, leglike support structures made of a material having a low coefficient of thermal conduction are laid out such that they are made as thin and long as the design permits (e.g., Tomohiro Ishikawa, et al., Proc. SPIE Vol. 3698, p. 556, 1999).

An infrared sensor having leglike support structures is described. FIG. 22 is a cross-sectional view showing a cross-sectional structure of infrared detection pixels in the infrared sensor having the prior art support leg structures. As shown in this figure, an SOI (silicon-on-insulator) substrate is formed by a silicon substrate 506, a buried oxide film 508, and a single-crystal silicon film 509. An infrared detection portion is formed on the patterned single-crystal silicon film 509 on this SOI substrate. This infrared detection portion utilizes a silicon pn junction described later. The single-crystal silicon film 509 under the single-crystal silicon substrate 506 is partially etched away to form a hollow structure 507. A dielectric film 510 is formed on the silicon substrate 506. A laminate structure consisting of a reflective layer 501, a dielectric layer 502, and an infrared absorber layer 503 is formed on the single-crystal silicon film 509. Infrared radiation is absorbed and converted into heat in this laminate structure. The produced heat is transmitted to the infrared detection portion of the single-crystal silicon film 509. A temperature variation due to heat is converted into a voltage change. An electrical signal caused by the voltage change is transmitted to conductive interconnects 517 in peripheral circuitry via a conductive interconnect 516. In FIG. 22, support leg structures include the conductive interconnect 516 and the dielectric film 510 surrounding the leg structures, and support the single-crystal silicon film pattern 509 above the substrate.

While the pixel size has been reduced to about 40 μm×40μm, microprocessing at the silicon LSI process level has been already accomplished. Therefore, it is difficult to improve the sensitivity further by devising improved layouts of the support structures. Similarly, it is difficult to further reduce the coefficient of thermal conduction which is one of characteristics of the material of the support structures. Indeed, with respect to conductive interconnect for sending out an electrical signal from the infrared detection portion, two conflicting requirements are imposed, i.e. electrical conduction and thermal conduction which are similar in mechanism. Consequently, it will be difficult to improve sensitivity by further material improvement.

Another method for improving the sensitivity is to improve the ratio of the variation dS in the electrical signal produced by a thermoelectric converter to the variation $dT_d$ in the temperature of the infrared detection portion, i.e., $dS/dT_d$. This method is an electrical method. It is important in this method, unlike the other two methods, that various electrical noises produced simultaneously be reduced. Various thermoelectric converter means have been reported.

For example, thermopiles for converting a temperature difference into an electric potential by the Seebeck effect (e.g., Toshio Kanno, et al., Proc. SPIE Vol. 2269, pp. 450–459, 1994), bolometers for converting a temperature change into a resistance change by a temperature variation of a resistor (e.g., A. Wood, Proc. IEDM, pp. 175–177, 1993), pyroelectric devices for converting temperature variations into electric charge by the pyroelectric effect (e.g., Charles Hanson, et al., Proc. SPIE Vol. 2020, pp. 330–339, 1993), and a silicon pn junction for converting a temperature change into a voltage change by a constant forward electric current (e.g., Tomohiro Ishikawa, et al., Proc. SPIE Vol. 3698, p. 556, 1999) have been reported.

Of these devices, the infrared detection device making use of a silicon pn junction is described in further detail in FIG. 23 which is a perspective view showing the structure of infrared detection pixels using the lateral pn junction. As shown in FIG. 23, a silicon layer pattern 609 is formed on a laminate structure comprising a silicon substrate 607 and a dielectric film 608. A pn junction is formed in each silicon layer pattern 609. Conductive interconnects 617 are formed between the silicon layer patterns 609 to connect the pn junctions of the silicon layer patterns 609 in series. This structure can obtain a larger voltage change owing to the series connection of the pn junctions. Hence, the detection sensitivity can be improved.

However, the actual situation is that any one electrical detection method is not decisively superior to other methods when these various methods are compared in terms of thermoelectric conversion characteristics, noise characteristics, and fabrication method. For example, bolometers are superior in temperature resolution. Meanwhile, silicon pn junctions are superior in fabrication method, because they can be manufactured only by silicon LSI fabrication steps.

In the formation of infrared detection devices, a unique conductive or metallization layer made of a material of low coefficient of thermal conduction is formed for the support conductive interconnects inside the support structures in order to read out signals from the infrared detecting portion. For example, support conductive structures of titanium material are known.

Where titanium itself is used, a process step for forming only the support conductive interconnect structures is necessary, besides process steps for forming conductive interconnects in device peripheral circuitry. Therefore, the process sequence is unavoidably complicated.

SUMMARY OF THE INVENTION

In view of the foregoing circumstances, the present invention has been made. It is an object of the present invention to provide a higher-sensitivity, uncooled infrared sensor that can be fabricated at lower cost by a simpler process method. It is another object of the invention to provide this simpler, lower-cost process method.

To solve the foregoing problems, a first embodiment of the present invention provides an infrared sensor, comprising a substrate including a plurality of infrared detection pixels arrayed on a substrate wherein each of the infrared detection pixels has an infrared absorption portion formed over the substrate and absorbing infrared radiation, a thermoelectric converter portion formed over the substrate and converting a temperature change caused by the infrared radiation absorbed by the infrared absorption portion into an electrical signal, and support structures for supporting the thermoelectric converter portion and the infrared absorption portion over the substrate via a separation space, the support structures having conductive interconnect layers for delivering the electrical signal from the thermoelectric converter portion to the substrate, a pixel selection circuit for selecting at least one of the infrared detection pixels which deliver the electrical signal, and an output circuit for outputting the electrical signal delivered from the selected infrared detection pixels via the conductive interconnect layers, at least one of the pixel selection circuit and the output circuit comprising MOS transistors, wherein the conductive interconnect layers include a material the same as gate layers of the MOS transistors and have the same thickness as the gate layers of the MOS transistors.

Preferably, the above-described first embodiment of the invention has the following configurations.

(1) Each of the conductive interconnect layers and the gate layers include a laminate structure having a polysilicon layer and a metal silicide layer.

(2) Each of the conductive interconnect layers and the gate layers include a laminate structure having a polysilicon layer and a metal layer.

(3) The support structures further include first dielectric layers covering side surfaces of the conductive interconnect layers, and the MOS transistors include second dielectric layers covering side surfaces of the gate layers thereof. The first dielectric layers include the same material as the second dielectric layers of the MOS transistors.

A second embodiment of the present invention provides an infrared sensor including, a substrate, a plurality of infrared detection pixels arrayed on a substrate wherein each of the infrared detection pixels has an infrared absorption portion formed over the substrate and absorbing infrared radiation, a thermoelectric converter portion formed over the substrate and converting a temperature change caused by the infrared radiation absorbed by the infrared absorption portion into an electrical signal, and support structures for supporting the thermoelectric converter portion and the infrared absorption portion over the substrate via a separation space, the support structures having conductive interconnect layers for delivering the electrical signal from the thermoelectric converter portion to the substrate and first dielectric layers covering side surfaces of the conductive interconnect layers, a pixel selection circuit for selecting at least one of the infrared detection pixels which delivers the electrical signal, and an output circuit for outputting the electrical signal delivered from the selected infrared detection pixels via the conductive interconnect layers, at least one of the pixel selection circuit and the output circuit comprising MOS transistors, the MOS transistors having second dielectric layers covering side surfaces of gate layers thereof, wherein the first dielectric layers include a material the same as the second dielectric layers of the MOS transistors.

In the second embodiment of the invention described above, the first dielectric layers are preferably formed to cover the side and top surfaces of the conductive interconnect layers of the support structures. Second dielectric layers narrower than the first dielectric layers are formed on at least one of the upper side of the first dielectric layers and the under side of the conductive interconnect layers.

A third embodiment of the present invention provides an infrared sensor including a substrate, a plurality of infrared detection pixels arrayed on a substrate wherein each of the infrared detection pixels has an infrared absorption portion formed over the substrate and absorbing infrared radiation, a thermoelectric converter portion formed over the substrate and converting a temperature change caused by the infrared radiation absorbed by the infrared absorption portion into an electrical signal, and support structures for supporting the thermoelectric converter portion and the infrared absorption portion over the substrate via a separation space wherein the support structures have conductive interconnect layers for delivering the electrical signal from the thermoelectric converter portion to the substrate, first dielectric layers covering side and top surfaces of the conductive interconnect layers, and second dielectric layers formed on at least one of the upper side of the first dielectric layers and the under side of the conductive interconnect layers wherein the widths of the second dielectric layers are smaller than the first dielectric layers, a pixel selection circuit for selecting at least one of the infrared detection pixels which deliver the electrical signal, and an output circuit for outputting the electrical signal delivered from the selected infrared detection pixels via the conductive interconnect layers.

In the second and third embodiments of the invention, the first dielectric layers include silicon nitride, and the second dielectric layers include silicon oxide.

The above-described first through third embodiments of the invention preferably have the following structures.

(1) The above-described substrate includes a single-crystal silicon support substrate, a silicon oxide layer formed on the single-crystal silicon support substrate, and a single-crystal silicon layer formed on the silicon oxide layer. The thermoelectric converter portion includes the single-crystal silicon layer.

(2) The bottom surfaces of the conductive interconnect layers of the support structures are exposed to the aforementioned separation space overlying the substrate.

(3) The above-described thermoelectric converter portion is exposed to the aforementioned space overlying the substrate.

(4) The above-described thermoelectric converter portion is formed in a single-crystal semiconductor layer, and is fabricated by the pn junction between a region of a first conductivity type and a region of a second conductivity type formed in the single-crystal semiconductor layer.

(5) The infrared absorption portion is fabricated by stacking a silicon nitride film on a silicon oxide film.

(6) The second dielectric layer on the first dielectric layer includes a layer the same as the silicon oxide film of the infrared absorption portion.

A fourth embodiment of the present invention provides a method of fabricating an infrared sensor having a plurality of infrared detection pixels on a substrate wherein each of the infrared detection pixels has an infrared absorption portion for absorbing infrared radiation and a thermoelectric converter portion for converting a temperature change caused by the infrared radiation absorbed by the infrared absorption portion into an electrical signal. The method includes forming the thermoelectric converter portion on the substrate, forming an conductive film on the substrate, patterning the conductive film to form first conductive film patterns in first areas where the infrared detection pixels should be formed and second conductive film patterns in second areas other than the first areas, etching portions of the substrate under the thermoelectric converter portions and the first conductive film patterns to form support structures for supporting the thermoelectric converter portions over the substrate via a separation space wherein the support structures have the first conductive film patterns as conductive interconnect layers for delivering the electrical signal from the infrared detection pixels, forming MOS transistors having gate layers including the second conductive film patterns, forming a pixel-selecting circuit for selecting at least one of the infrared detection pixels which deliver the electrical signal, the pixel-selecting circuit including at least one of the MOS transistors, and forming an output circuit for outputting the electrical signal delivered from the selected infrared detection pixels via the conductive interconnect layers wherein the output circuit includes at least one of the MOS transistors.

Preferably, the above-described fourth embodiment of the invention has the following structures.

(1) The conductive film includes a laminate structure including a polysilicon layer and a metal silicide layer, and each of conductive interconnect layers and the gate layers includes the polysilicon/metal silicide laminate structure.

(2) The conductive film includes a laminate structure having a polysilicon layer and a metal layer, and each of conductive interconnect layers and the gate layers includes the polysilicon/metal laminate structure.

(3) The method further includes forming first dielectric layers on side and top surfaces of gate layers of the MOS transistors, and forming second dielectric layers to cover side and top surfaces of the conductive interconnect layers of the support structures, wherein the first and second dielectric layers are formed patterning the same dielectric film.

A fifth embodiment of the present invention provides a method of fabricating an infrared sensor including a plurality of infrared detection pixels on a substrate wherein each of the infrared detection pixels has an infrared absorption portion for absorbing infrared radiation and a thermoelectric converter portion for converting a temperature change caused by the infrared radiation absorbed by the infrared absorption portion into an electrical signal. The method includes forming first conductive film patterns on first areas where the infrared detection pixels should be formed, forming second conductive film patterns on second areas other than the first areas, forming first dielectric layers to cover side and top surfaces of each of the first and second conductive film patterns, etching portions of the substrate under the thermoelectric converter portions and the first conductive film patterns to form support structures for supporting the thermoelectric converter portions over the substrate via separation a space wherein the support structures have the first conductive film patterns as conductive interconnect layers for delivering the electrical signal from the infrared detection pixels, forming MOS transistors having gate layers including the second conductive film patterns and the first dielectric layers, forming a pixel-selecting circuit for selecting at least one of the infrared detection pixels which deliver the electrical signal wherein the pixel-selecting circuit include at least one of the MOS transistors, and forming an output circuit for outputting the electrical signal delivered from the selected infrared detection pixels via the conductive interconnect layers wherein the output circuit includes at least one of the MOS transistors.

A sixth embodiment of the present invention provides a method of fabricating an infrared sensor including a plurality of infrared detection pixels on a substrate wherein each of the infrared detection pixels has an infrared absorption portion for absorbing infrared radiation and a thermoelectric converter portion for converting a temperature change caused by the infrared radiation absorbed by the infrared absorption portion into an electrical signal. The method includes forming recessed portions in areas of the substrate where the infrared detection pixels should be formed, forming isolation dielectric layers in the recessed portions, forming first conductive film patterns on the isolation dielectric layers, forming a first dielectric layers to cover side and top surfaces of the first conductive film patterns, forming a second dielectric layer on the first dielectric layers, etching portions of the substrate under the thermoelectric converter portions and the first conductive film patterns to form support structures for supporting the thermoelectric converter portions over the substrate via a separation space wherein the support structures have the first conductive film patterns as conductive interconnect layers for delivering the electrical signal from the infrared detection pixels, selectively etching the isolation dielectric layers and the second dielectric film relative to the first dielectric layers to remove at least one of the isolation dielectric layers and portions of the second dielectric film on the first dielectric layers or to make widths thereof smaller than the first dielectric layers, forming a pixel-selecting circuit for selecting at least one of the infrared detection pixels which deliver the electrical signal wherein the pixel-selecting circuit includes at least one MOS transistor, and forming an output circuit for outputting the electrical signal delivered from the selected infrared detection pixels via the conductive interconnect layers wherein the output circuit includes at least one MOS transistor.

The fifth and sixth embodiments of the present invention described thus far preferably have the following structures.

(1) The first dielectric layers include silicon nitride, and the second dielectric layers include silicon oxide.

(2) A liquid mixture of acetic acid and ammonium fluoride is used as an etchant for etching the silicon oxide layer which is the second dielectric layer.

The above-described fourth through sixth embodiments of the present invention preferably have the following structures.

(1) The aforementioned substrate includes a single-crystal silicon support substrate, a silicon oxide film formed on this support substrate, and a single-crystal silicon layer formed on the silicon oxide film. The above-described thermoelectric converter portions are formed in the single-crystal silicon layer.

(2) The thermoelectric converter portions are fabricated by forming regions of first and second conductivity types, respectively, on the single-crystal semiconductor layer so as to form pn junctions.

(3) The infrared absorption portions are fabricated by stacking a silicon nitride film on the silicon oxide film.

(4) The second dielectric film includes a layer the same as the silicon oxide film of the infrared absorption portions.

(5) The single-crystal support substrate is a single-crystal silicon substrate. During forming the support structures, an etchant that wet etches the single-crystal silicon anisotropically is used as the etchant for etching the single-crystal support substrate.

According to the present invention, if a layout on a plane limited by a level of micromachining remains the same, then the cross-sectional area of the support structures between the infrared detection portions and the support substrate can be reduced. Therefore, heat transfer through the support structures, dominating the heat transportation between each infrared radiation detection portion and the support substrate, can be reduced. As a result, a high-sensitivity, uncooled infrared sensor can be obtained.

Furthermore, according to the present invention, the width of the support structures is reduced to decrease the cross-sectional area of the support structures. In spite of the decrease in the cross-sectional area of the support structures, the mechanical strength necessary for the support of the infrared sensor portions does not decrease. Also, it is unlikely that the acceleration resistance decreases.

In addition, according to the present invention, the bottom surfaces of the infrared detection portions and parts or bottom surfaces of the support conductive interconnects are exposed. The material of the infrared detection portions (e.g., a single-crystal silicon) and a metal material (e.g., titanium) or polysilicon forming the support conductive interconnects are much lower in infrared emissivity in the 10 µm-band than the prior art diaphragm structure and the silicon oxide film or silicon nitride film existing at the bottoms of the support structures. Accordingly, with the bottom-exposed structures described above, heat transportation due to radiation from the bottom surfaces can be reduced. As micromachining technology progresses, pixels and support structures will become finer. Under this trend, it is forecasted that heat transportation due to radiation from the silicon oxide film or silicon nitride film existing at the bottoms of the aforementioned diaphragm structures and support structures will be at the same level as the heat conduction through the support structures. Where the sensitivity is increased simply by reductions in dimensions, heat transportation owing to the aforementioned radiation will create a sensitivity limitation. Accordingly, under the trend toward miniaturization, the above-described bottom-exposed structures can provide a higher-sensitivity, uncooled infrared sensor.

Further, according to the present invention, the support conductive interconnects formed inside the support structures for readout of signals from the infrared detection portions are formed from a layer the same as the gate electrodes of MOS transistors formed in device peripheral circuitry. Therefore, the unique support conductive interconnect layer that has been necessary conventionally is dispensed with. In consequence, the number of process steps can be decreased. Additionally, the device fabrication yield can be improved. Hence, a low-cost, uncooled infrared sensor can be obtained. Moreover, the support conductive interconnect structures can be made finer, because the support conductive interconnects are made of a layer the same as the gate electrodes of the MOS transistors described above. Further, use of a structure of polycide or polymetal that has a low resistivity makes it possible to obtain high-sensitivity device characteristics.

Further, according to the present invention, a first dielectric film is formed on the support conductive interconnects, and the support conductive interconnects can be protected against etching by the dielectric film. Accordingly, where the substrate or the second dielectric film (device-isolating dielectric film, interlayer dielectric film on the substrate, buried dielectric film of SOI, or the like) formed on top of or under the support conductive interconnects is etched, the support conductive interconnects can be protected against the etching. This can prevent various problems including excessive thinning of the support conductive interconnects, which would otherwise lead to an increase of the resistivity and generation of breakage of the support conductive interconnects, thus causing defects.

Further, the aforementioned first dielectric film can be built simultaneously with the gate sidewall dielectric film formed on the sidewalls of the gates of the MOS transistors in the peripheral circuitry. Specifically, where a dielectric film such as a silicon nitride film is formed on the sidewalls of the gates of the MOS transistors in the peripheral circuitry and the dielectric film is etched, the dielectric film may be selectively left on the gate sidewalls. A second dielectric film can be formed simultaneously (in the same layer) with the step of formation of the first-mentioned dielectric film on the support conductive interconnects. Also, in this case, the number of process steps can be decreased. Especially, by employing both the step of formation of this dielectric film and the step of forming the gate electrodes of the MOS transistors in the peripheral circuitry in the same layer, high-sensitivity support structures can be manufactured at low cost and at high yield by making maximum use of the process matching.

As described thus far, the present invention makes it possible to obtain a low-cost, high-sensitivity, uncooled infrared sensor.

BRIEF DESCRIPTION OF THE DRAWINGS

FIGS. 4A–4E are cross-sectional views illustrating process steps for fabricating structures for supporting the sensor portions of the infrared sensor and MOS transistors formed in the sensor device peripheral circuitry in accordance with the first embodiment of the invention;

FIGS. 5F–5I are cross-sectional views illustrating process steps following the steps illustrated in FIGS. 4A–4E;

FIGS. 7A–7B are cross-sectional views illustrating process steps for fabricating structures for supporting the sensor portions of the infrared sensor and MOS transistors formed in the sensor device peripheral circuitry in accordance with the first and second embodiments of the invention;

FIGS. 8C–8D are cross-sectional views illustrating process steps following the steps illustrated in FIGS. 7A–7B;

FIGS. 9E–9F are cross-sectional views illustrating process steps following the steps illustrated in FIGS. 8C–8D;

FIGS. 11A–11B are cross-sectional views illustrating process steps for fabricating structures for supporting the sensor portions of the infrared sensor and MOS transistors formed in the sensor device peripheral circuitry in accordance with the third and forth embodiments of the invention;

FIGS. 12C–12D are cross-sectional views illustrating process steps following the steps illustrated in FIGS. 11A–11B;

FIGS. 16A–16B are cross-sectional views illustrating process steps for fabricating structures for supporting the sensor portions of the infrared sensor and MOS transistors formed in the sensor device peripheral circuitry in accordance with the fifth and sixth embodiments of the invention;

FIGS. 17C–17D are cross-sectional views illustrating process steps following the steps illustrated in FIGS. 16A–16B;

FIGS. 18E–18F are cross-sectional views illustrating process steps following the steps illustrated in FIGS. 17C–17D;

FIGS. 19A–19B are cross-sectional views illustrating process steps for fabricating structures for supporting the sensor portions of the infrared sensor and MOS transistors formed in the sensor device peripheral circuitry in accordance with the seventh and eighth embodiments of the invention;

FIGS. 20C–20D are cross-sectional views illustrating process steps following the steps illustrated in FIGS. 19A–19B;

FIG. 21 is a cross-sectional view illustrating process steps following the steps illustrated in FIGS. 20C–20D;

FIG. 22 is a cross-sectional view showing the cross-sectional structure of infrared detection pixels in the related art infrared sensor.

DESCRIPTION OF THE PREFERRED EMBODIMENTS

Figures 1, 2:
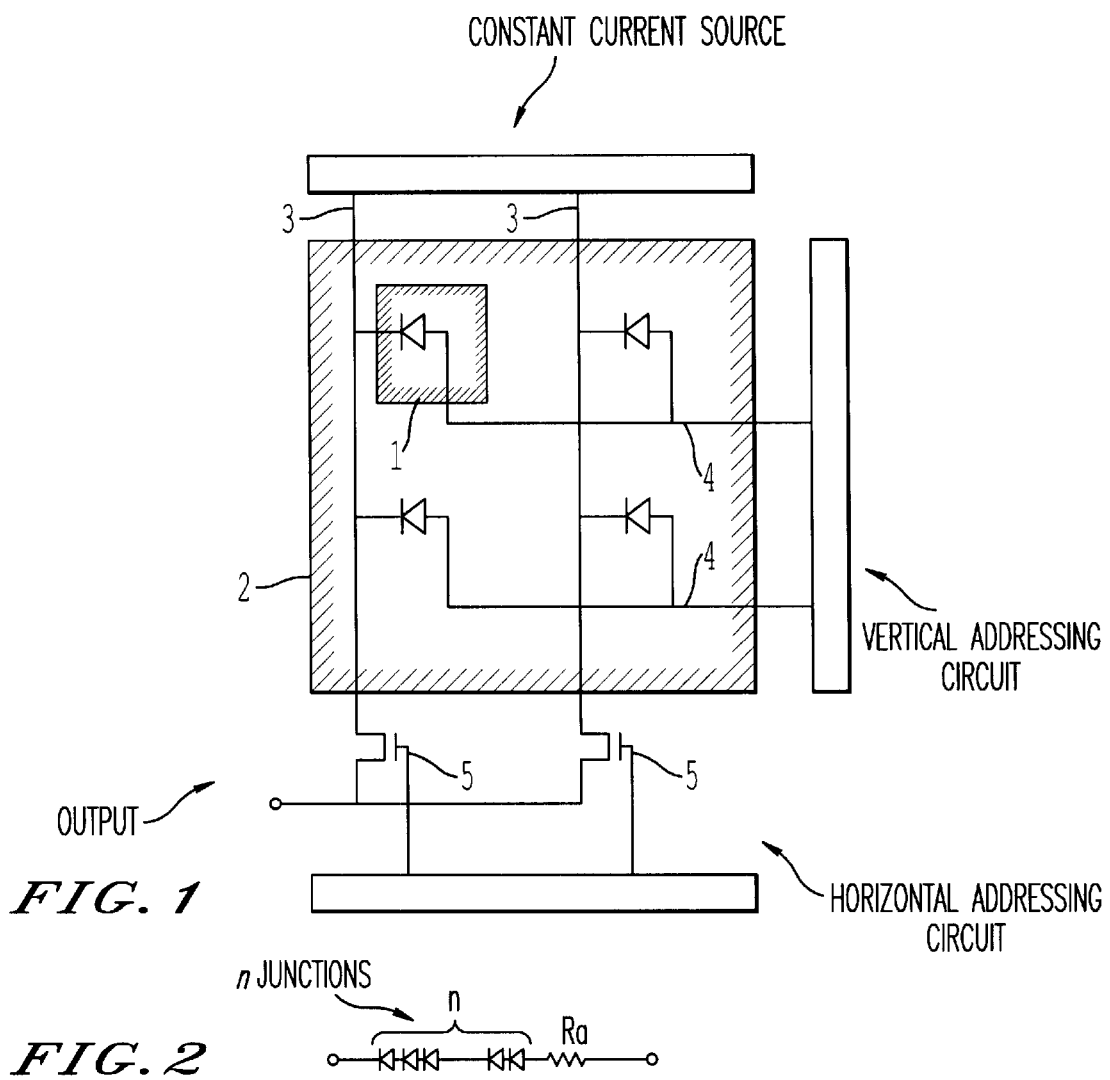
FIG. 1 is a view showing the whole construction of an infrared sensor in accordance with a first embodiment of the present invention.
FIG. 2 is an equivalent circuit diagram of infrared detection pixels of the infrared sensor in accordance with the first embodiment of the invention.

Embodiments of the present invention are hereinafter described in detail by referring to the drawings.

FIRST EMBODIMENT

FIG. 1 is a view showing the whole structure of an infrared sensor in accordance with the present embodiment. Infrared detection pixels 1 for converting incident infrared radiation into an electrical signal are arrayed in two dimensions on a semiconductor substrate. A vertical addressing circuit and a horizontal addressing circuit for selecting pixels are disposed adjacent to the IR detection pixel array 2. The sensor further includes an output portion for producing signals from the selected pixels in succession. Each infrared detection pixel 1 of FIG. 1 is a forward biased pn junction. A constant current source for forward biasing the pn junction of each pixel is also disposed adjacent to the infrared detection pixel array 2. In FIG. 1, the infrared detection pixel array 2 is shown to consist of 2×2 pixels, or 4 pixels arranged in 2 rows and 2 columns.

The rows of infrared detection pixels selected by the vertical addressing circuit are supplied with a forward bias current from the constant current source. The current flows through current paths for the vertical signal lines 3, the selected pixels 1, and the horizontal addressing lines 4. Signal voltages developed on the vertical signal lines 3 are successively selected and taken out by the horizontal addressing circuit.

FIG. 1 shows the simplest example in which signal voltages developed on the vertical signal lines 3 are delivered via column-selecting transistors 5 successively selected by the horizontal addressing circuit. Since the signal voltages are very weak, signal voltages may be read out for each successive column, amplified, and retained for 1H period, for example. In this way, the signal voltages are amplified, and reduction of noise can be accomplished by limiting the signal bandwidth, thus providing better results.

FIG. 2 shows an equivalent circuit of the infrared detection pixels of FIG. 1. In this configuration, n pn junctions are connected in series to provide higher sensitivity. A resistor Ra is added in series of the pn junctions. The added resistor Ra includes interconnect resistance R1 (i.e., a resistance inside each pixel between each pn junction and each horizontal addressing line 4 and between each pn junction and each vertical signal line 3), the resistance Rc of the contact between the interconnect and the pn junction, and the resistance Rs of the p- and n-regions of the pn junction.

Figure 3A:
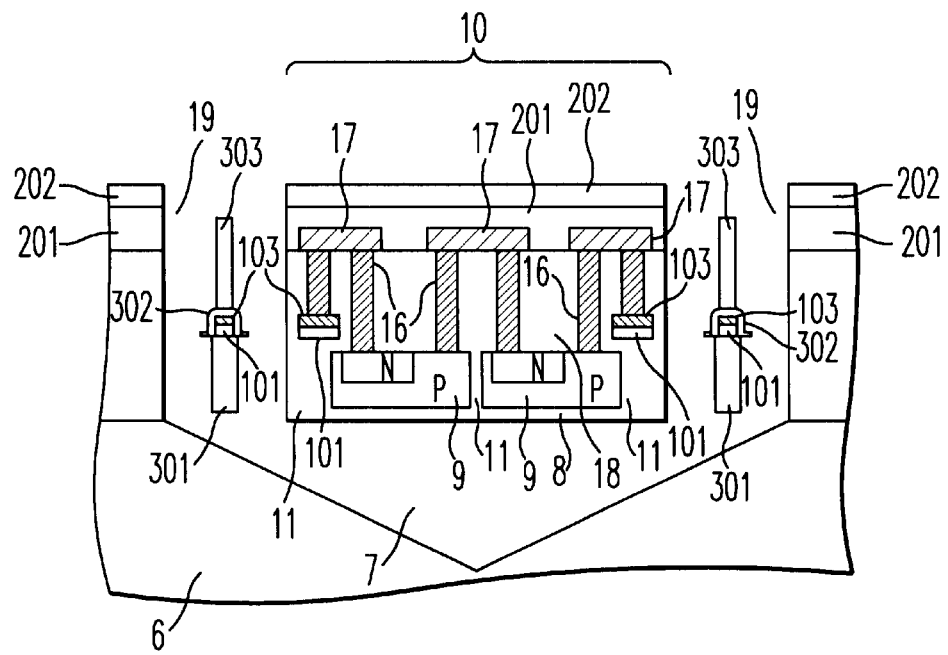
FIGS. 3A–3B are views showing the cross-sectional structure and the two-dimensional structure of the infrared detection pixels of the infrared sensor in accordance with the first embodiment of the invention.

FIG. 3A is a view schematically showing the configuration, illustrating the cross-sectional structure of the infrared detection pixels shown in FIG. 2 and the two-dimensional structure. Each infrared detection pixel includes a hollow structure 7 formed inside a single-crystal silicon support substrate 6, a sensor portion 10 formed on the hollow structure 7, a support portion for supporting the sensor portion 10 to the hollow structure 7 and taking an electrical signal from the sensor portion 10, and connector portions (not shown) for interconnecting the sensor portion 10, vertical signal lines 3, and horizontal addressing lines 4. The sensor portion 10 includes infrared absorption layers 201, 202 formed on the hollow structure 7, a pn junction lying inside an SOI layer 9 formed for thermoelectric conversion, and a buried silicon oxide film layer 8 supporting the SOI layer 9.

The support portion includes a support conductive interconnect structure and support dielectric structures 301, 302, 303 protecting the support conductive interconnect structure. The support conductive interconnect structure includes a laminate structure having polysilicon layer 102 and a metal silicide layer 103.

Figure 3B:
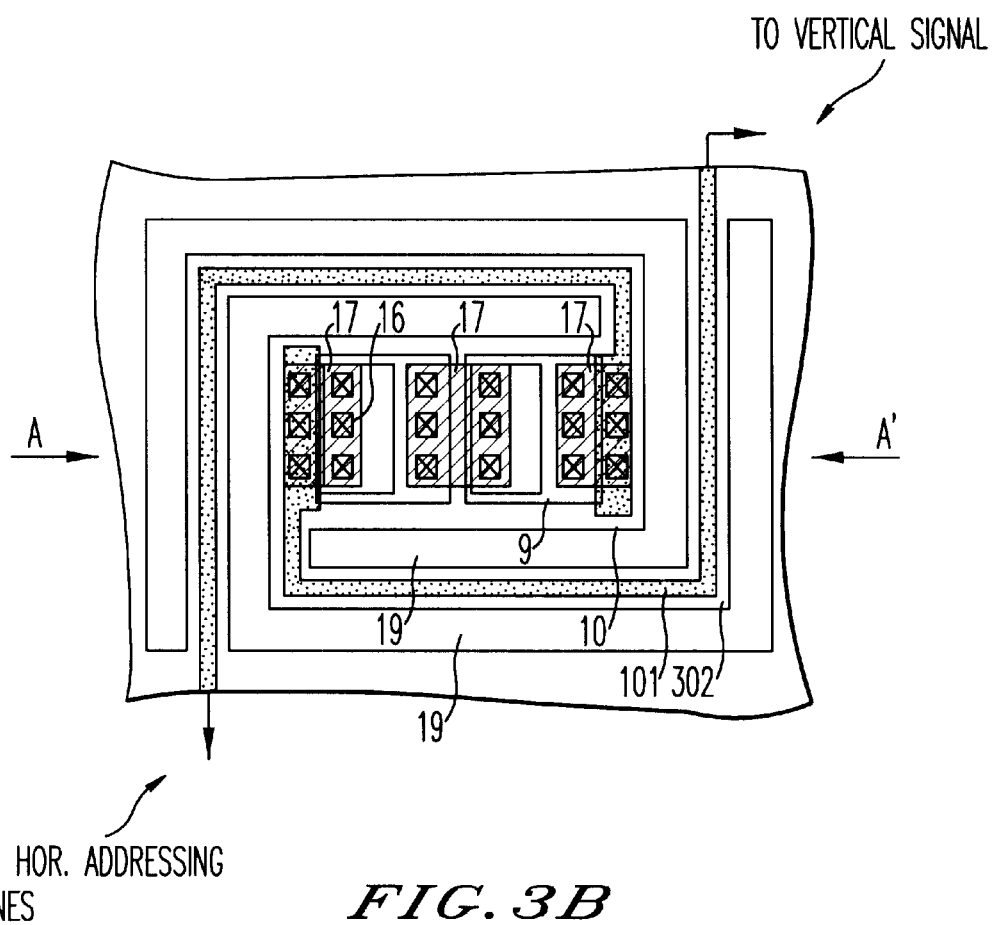

Since the sensor portion 10 and the support portion are formed on the hollow structure 7, it is assured that incident infrared radiation efficiently modulates the temperature of the sensor portion 10. FIG. 3A and FIG. 3B show a structure in which n=2.

The process steps for fabricating the infrared detection pixels are shown in FIG. 4 which are carried out prior to formation of the hollow structure. Process steps for forming the hollow structure are described separately below.

Process steps up to the formation of the hollow structure are first described by referring to FIGS. 4A–4E and 5F–5I, which show both the cross-sectional structure of MOS transistors used in the sensor device periphery circuitry and the structure for supporting the sensor portion to the hollow structure. The support conductive interconnect structure is fabricated from the same layer as the gate electrodes of the MOS transistors.

First, a silicon-on-insulator (SOI) substrate is prepared as the semiconductor substrate. This substrate is created by stacking the buried silicon oxide film layer 8 and the single-crystal silicon layer 9 on the single-crystal silicon support substrate 6 successively. As an example of device isolation in a general LSI fabrication sequence, an STI (shallow-trench isolation) step is carried out. In particular, a device isolation region is defined by photolithography or other technique. The single-crystal silicon layer 9 on the device isolation region is etched away by reactive-ion etching (RIE), or other technique. Then, a device isolation silicon oxide film 11 is buried by chemical vapor deposition (CVD) or other technique. The film is then planarized by chemical-mechanical polishing (CMP) or other technique.

At this time, the support structure regions are also defined as device isolation regions, and the device isolation silicon oxide film 11 is buried into these regions.

Then, a support conductive interconnect structure is formed simultaneously with MOS transistors used in the peripheral circuitry including an addressing circuit, an output portion, and a constant current source. That is, after a gate insulator layer (oxide film) 12 and a polysilicon layer 101 are formed, the gate electrodes 101 of the MOS transistors are processed by photolithography and RIE. At the same time, the support conductive interconnects 101 are processed. Ions are implanted into the gate electrodes 101 in a self-aligned manner to form a lightly doped drain (LDD) region 13 (FIG. 4A).

Thereafter, sidewall formation and formation of doped source/drain regions that are general LDD structure formation steps are carried out. First, a silicon nitride film 14 to become the sidewalls is deposited over the whole surface of the substrate by CVD (FIG. 4B). Therefore, the support conductive interconnects 101 are also covered with the silicon nitride film 14. Then, the silicon nitride film 14 is etched to an appropriate amount by RIE. When the etching of the planar portion is completed, sidewalls 14 are formed on steps created by the gate electrodes 101 and support conductive interconnects 101 by anisotropic etching effects of RIE. Under this condition, ions are implanted to form doped source/drain regions 13' in a self-aligned manner (FIG. 4C).

Then, a polycide formation step is performed to reduce the resistivities of the gate electrodes 101 and of the support conductive interconnects 101. In the following description, a salicide step produces a self-aligning polycide structure.

First, the gate insulator film 12 is etched with dilute hydrofluoric acid, using the gate electrodes 101, the support conductive interconnects 101, and the sidewalls 14 as a mask, to expose the silicon layer 9 in the source/drain regions of the MOS transistors. Then, the metal film 102 for formation of a metal silicide is deposited over the whole surface (FIG. 4D).

Under this condition, appropriate annealing is carried out to cause the gate electrodes 101, support conductive interconnects 101, and the exposed silicon on the source/drain regions to react with the metal film 102, creating the metal silicide layer 103 (FIG. 4E). Preferably, a high-melting-point metal such as titanium or tungsten is used as the metal film 102.

Then, the metal layer 102 in the unsilicided regions is removed with an etchant that shows selectivity with respect to the metal silicide layer 103 (FIG. 5F). Where titanium is used as the metal film 102, for example, the metal film 102 can be selectively etched away with a liquid mixture of sulfuric acid and hydrogen peroxide water.

Subsequently, a silicon nitride film 15 is deposited over the whole surface of the substrate to protect the metal silicide layer 103 formed on the polycide gate electrodes, polycide support conductive interconnects, and source/drain regions (FIG. 5G). With respect to a salicide process for forming the polycide structure and a polymetal structure capable of decreasing the resistivity, methods and structures described in Japanese patent laid-open Nos. 115196/1995 and 202189/1995, for example, can be adopted. The entire contents of which are incorporated herein by reference.

In the present embodiment, an example is given in which gate electrodes and support conductive interconnects are formed using a polycide structure. A polymetal structure (i.e., a laminate structure consisting of a polysilicon layer and a metal layer) enabling further decrease in the resistivity can also be employed. Thermal noise arising from the electrical resistivity in the support conductive interconnects can be reduced further. This is more preferable because higher sensitivity can be accomplished. In this case, with respect to the laminate structure consisting of the gate electrode and support conductive interconnects, a titanium nitride film acting as a barrier metal and a tungsten film for lowering the resistivity can be stacked on the polysilicon layer 101 instead of the metal silicide layer 103.

A silicon oxide film is deposited as a dielectric film 16 by CVD and planarized by CMP (FIG. 5H). At this time, the silicon nitride film 15 can be used as a stopper for the CMP.

Then, contact holes 16 are formed by RIE, and plugs 16 are buried into the contact holes. For example, the plugs 16 can be buried by depositing a tungsten film over the whole substrate surface by CVD and performing a CMP. Similarly, contact holes (not shown) are formed in the gate electrodes 101, 103 and in the support conductive interconnects 101, 103, and plugs 16 are buried into the holes.

Aluminum metallization or aluminum-alloy metallization provides the conductive interconnects 17, and then an infrared absorption layer acting also as a passivation layer for the MOS transistors is formed. In the figure, the silicon oxide film 201 and silicon nitride film 202 are stacked as infrared absorption layers (FIG. 5I). With the structure of FIG. 5I, the passivation layers 201 and 202 efficiently absorb infrared radiation.

Figure 6A:
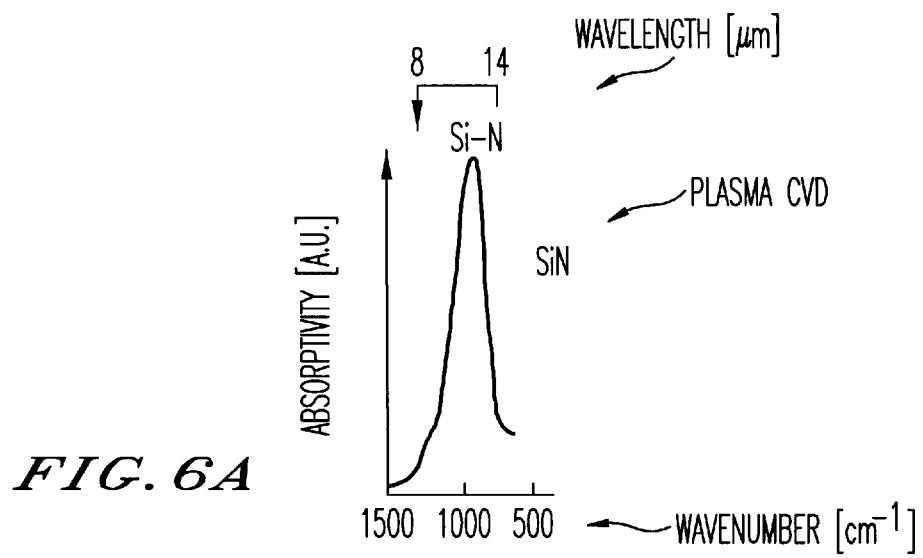
FIGS. 6A–6C are characteristic diagrams illustrating absorption of a CVD silicon nitride film, a CVD silicon oxide film, and a thermally oxidized silicon oxide film in the 10 $\mu$m-band, respectively.
Figure 6B:
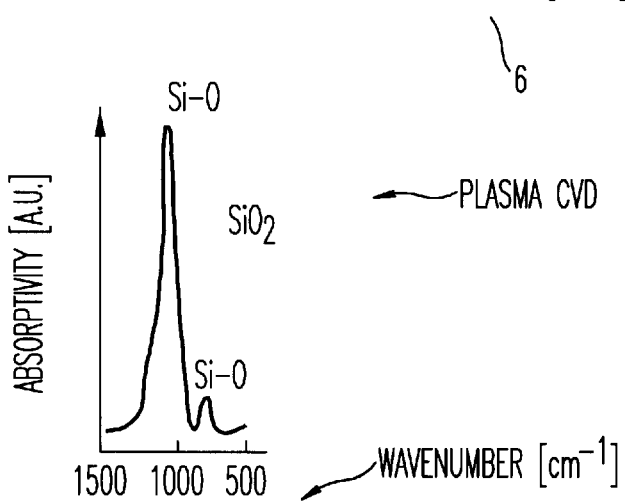
Figure 6C:
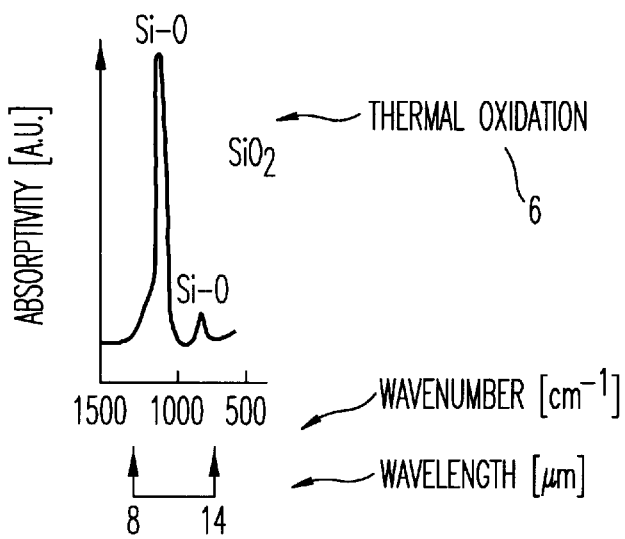

The infrared absorption characteristics of the silicon nitride film and silicon oxide film near 10 $\mu$m are shown in FIG. 6A–6C. As can be seen from FIG. 6A, the silicon nitride film 202 on the front side shows an absorption peak attributable to Si—N bond near 12 $\mu$m. The silicon oxide film 201 on the substrate side (FIG. 6B) shows an absorption peak attributable to Si—O bond near 10 $\mu$m. Accordingly, incident radiation can be efficiently absorbed and converted into heat by stacking these layers of different absorption peaks. FIG. 6C shows an absorption peak of a thermally oxidized silicon oxide film.

The process steps later than FIG. 5I, i.e., the step for forming a hollow structure and preceding and ensuing steps, are described below.

FIGS. 7A–9E are views illustrating steps for fabricating an infrared sensor in accordance with the first embodiment of the present invention. The cross-sectional structures of MOS transistors in the peripheral circuitry and support structures are also shown in the same way as in FIGS. 4 and 5. The bonding pad is formed in the conductive interconnect layer lying immediately over the source/drain regions. Of course, other structures can also be adopted.

In the present embodiment, only one conductive interconnect (metallization) layer 17 is formed as shown in FIGS. 7A–9E. Of course, it is possible that multilayer metallization is formed, and the top metallization layer is used as a bonding pad.

First, the silicon nitride film 202 and the silicon oxide film 201 are etched by RIE to form a bonding pad opening 401 (FIG. 7A). The reason why the bonding pad opening 401 is formed prior to anisotropic etching of silicon for formation of a hollow structure as described later is that it is difficult to apply a resist used for formation of the bonding pad opening 401 after the formation of the hollow structure. In this process step, the silicon nitride film 202 and the silicon oxide film 201 on the front side of the support structure can be etched simultaneously (FIG. 7A). The cross-sectional area of the support structure can be reduced by this method.

Also, the sensitivity can be enhanced. Of course, the support dielectric layer of only the support structure on the front side can be etched by a process step different from the step for forming the pad opening 401.

Then, a silicon oxide film 402 is deposited as a protective layer over the whole surface to thereby prevent the bonding pad 17 from being etched during anisotropic etching of silicon for formation of the hollow structure (FIG. 7B).

Thereafter, an etch hole 19 for formation of the hollow structure is formed by RIE to expose the single-crystal silicon support substrate 6 (FIG. 8C). At this point, all the regions other than the etch hole 19 are covered with the protective silicon oxide film 402.

Then, the silicon is etched anisotropically to form the hollow structure. TMAH (tetramethyl ammonium hydroxide) or other chemical is used as an etchant for the anisotropic etching of the single-crystal silicon. Thus, a hollow structure 7 is formed inside the single-crystal silicon support substrate 6 (FIG. 8D).

Finally, to expose the bonding pad, the protective oxide film 402 is etched. At this time, a liquid mixture of acetic acid and ammonium fluoride is preferably used as the etchant for enhancing the selectivity ratio of the bonding pad 17 vs. aluminum.

During etching of the protective oxide film 402, the silicon oxide films 201, 18, 11, and 8 forming the support structure are also etched. However, the silicon nitride film 15 is not etched. A cross-sectional shape as shown in FIG. 9E is obtained. A plan view and a cross section of infrared detection pixels under this condition are shown in FIG. 3. The silicon nitride films 14 and 15 correspond to the support dielectric structure 302. The silicon oxide films 201 and 18 correspond to the support dielectric structure 303. The silicon oxide films 11, 8 and the gate insulator layer (oxide film) 12 correspond to the support dielectric structure 301. During this etching process, the silicon nitride film 202 acts to protect the silicon oxide film 201. Consequently, decrease of the film thickness of the infrared absorber can be suppressed.

At this time, the front and side surfaces of the metal silicide layer 103 that shows a low chemical resistance against ammonium fluoride are protected by the silicon nitride film 15. The bottom surface is protected by the polysilicon 101. Therefore, the support conductive interconnects, or metallization, remain unetched.

With the present structure, the width of the support structure can be decreased beyond the limitations of miniaturization of lithography. Because the cross-sectional area can be reduced, the sensitivity can be enhanced. Simultaneously, ultrafine machining is possible since the support structure is formed in the same layer as the gate electrodes of the MOS transistors. As a result, the sensitivity can be enhanced further.

Furthermore, use of a low-resistivity material such as polycide or polymetal can suppress thermal noise due to the electrical resistivity of the support conductive interconnects. This effect also enhances the sensitivity.

In addition, the silicon nitride film 15 can be made of the same layer as the silicon nitride film 15 formed on the sidewalls of the gates of the MOS transistors in the peripheral circuitry. Therefore, the number of process steps can be reduced greatly. Especially, by using both the step of forming the silicon nitride film 15 and the step of forming the silicon nitride film 15 from the same layer as the gate electrodes of the MOS transistors in the peripheral circuitry, high-sensitivity support structures can be fabricated at low cost and high yield by making maximum use of the process matching.

SECOND EMBODIMENT

A second embodiment of the present invention is next described.

FIGS. 7A–9F are views illustrating process steps for fabricating an infrared sensor in accordance with the second embodiment of the invention. Cross-sectional structures of MOS transistors in the peripheral circuitry and of support structures are also shown in the same way as in FIGS. 4 and 5. A bonding pad is formed in a conductive interconnect layer located immediately over the source/drain regions. Of course, other structures may also be adopted.

In the present embodiment, one layer of metallization, or conductive interconnects, 17 is formed as shown in FIGS. 7A–9F. Obviously, multilayer metallization may be formed, and the top metallization layer may be used as a bonding pad.

In the present embodiment, process steps of FIGS. 7A–9F are exactly the same with their counterparts of the first embodiment described previously. Therefore, description of these steps is omitted. The final structure of the first embodiment is shown in FIG. 9E. By etching the silicon oxide film further, a structure as shown in FIG. 9F is obtained. The silicon nitride films 14 and 15 correspond to the support dielectric structure 302.

In the bonding pad opening 401, side etching of the silicon oxide film 201 progresses, and an overhanging profile of the silicon nitride film 202 appears. It is to be noted, however, that the conductive interconnects 17 located immediately over the source/drain regions of the MOS transistors are shown as a bonding pad for the sake of convenience. Therefore, the overhanging profile is exaggerated compared to the actual geometry. It can be sufficiently neglected in comparison with the actual dimensions of the bonding pad and is within a tolerable range.

On the other hand, with respect to the support structure, the silicon oxide films 201, 18, 11, and 8 that supported the support dielectric layer have been fully etched away. Only the support conductive interconnects 101, 103 of the polycide structure and the silicon nitride films 14, 15 for protecting the interconnects are left behind. This geometry is accomplished by the cross-sectional structure in which the metal silicide layer 103 is completely protected by the silicon nitride films 14, 15 and the polysilicon 101.

Figure 10A:
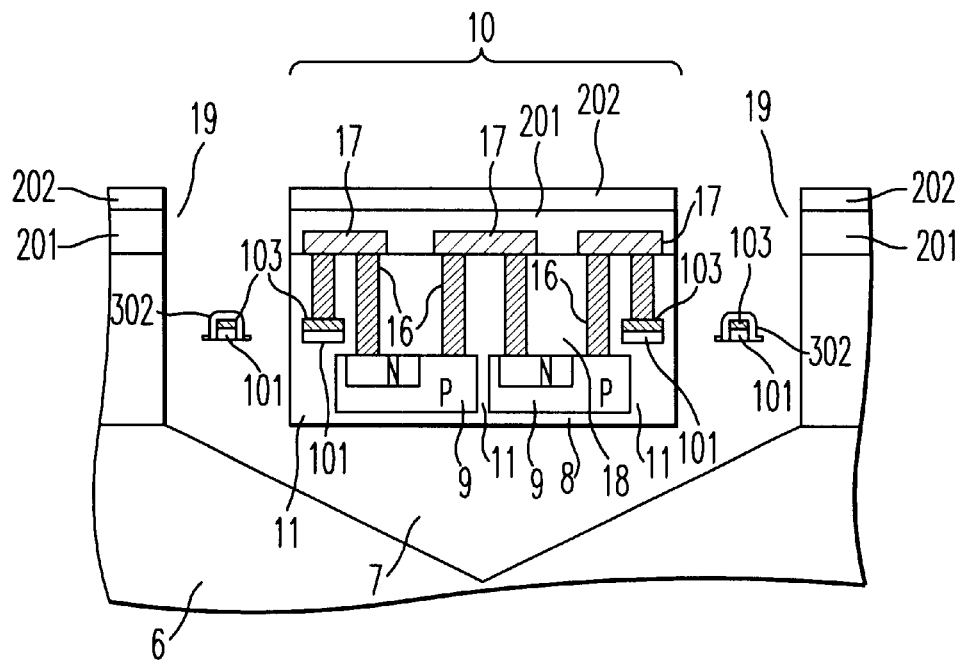
FIGS. 10A–10B are views showing the cross-sectional structure and the two-dimensional structure of infrared detection pixels of the infrared sensor in accordance with the second embodiment of the invention.
Figure 10B:
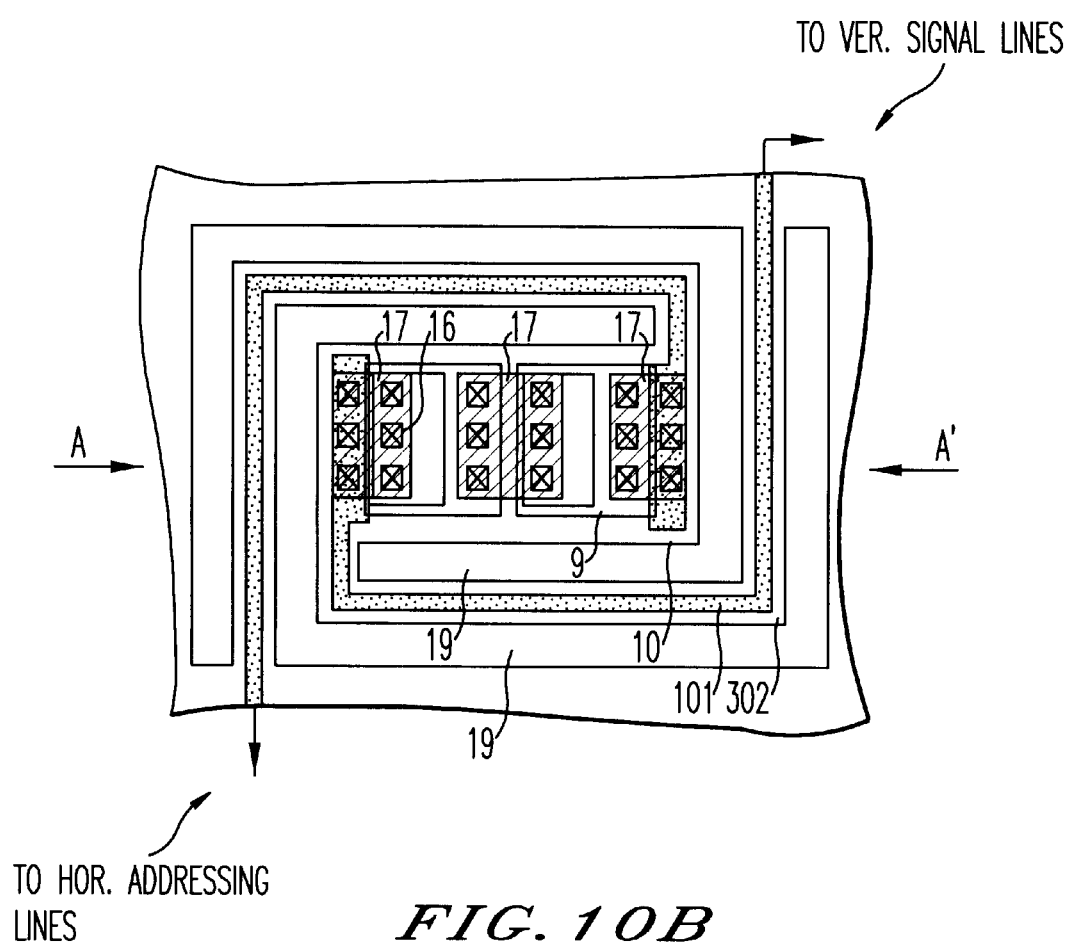

The pixel structure under this condition is shown in FIG. 10A–10B. As can be seen from FIG. 10A, the cross-sectional area of the support structures has been reduced greatly. This leads to a great decrease in the thermal transfer through the support structures, which in turn results improved sensitivity.

With this structure, the width of the support structures can be reduced beyond the limitations of miniaturization of lithography. In addition, the thermal transfer through the support structures is reduced to a level where the thermal transfer is substantially dominated only by the support conductive interconnects. The reduction in the cross-sectional area can enable a corresponding improvement in sensitivity. At the same time, the conductive interconnects are formed in the same layer as the gates of the MOS transistors, thus permitting ultrafine machining. The ultrafine machining improves the sensitivity.

Furthermore, thermal noise arising from the electrical resistivity of the support conductive interconnects can be reduced, because a low-resistivity material such as polycide or polymetal is used. The low-resistivity of the polycide or polymetal improves the sensitivity.

Besides, the same effects as produced by the first embodiment can be produced.

THIRD EMBODIMENT

A method of fabricating an infrared sensor in accordance with a third embodiment of the present invention is next described by referring to FIGS. 11A–12D. The description will center on process steps carried out before and after the step of etching silicon.

FIGS. 11A–12D are views illustrating steps for fabricating the infrared sensor in accordance with the third embodiment of the invention. Cross-sectional structures of MOS transistors in the peripheral circuitry and of support structures are also shown in the same way as in FIGS. 4 and 5. A bonding pad is formed in a conductive interconnect layer located immediately over the source/drain regions. Of course, other structures may also be adopted.

In the present embodiment, only one layer of metallization, or conductive interconnects, 17 is formed as shown in FIGS. 11A–12D. Of course, multilayer metallization may be formed, and the top metal layer may be used as a bonding pad.

First, a silicon nitride film 202 and a silicon oxide film 201 are etched by RIE to form a bonding pad opening 401. The RIE is stopped under the condition where the pad 17 is not exposed through the opening 401, by controlling the amount of etching. Generally, in order that an appropriate amount of etching be done, the silicon oxide film 201 is partially etched (FIG. 11A).

At this time, the silicon nitride film 202 and silicon oxide film 201 on the front side of the support structures can be etched simultaneously. This can reduce the cross-sectional area of the support structures. Hence, the sensitivity can be enhanced. FIG. 11A illustrates this case. Of course, only the support dielectric layer on the front side of the support structures can be etched by a process step different from the step for forming the pad opening 401.

The etch hole 19 for formation of a hollow structure is formed by RIE to expose a single-crystal silicon support substrate 6 (FIG. 11B). At this time, all the regions excluding the etch hole 19 are covered with the silicon oxide film 201 and silicon nitride film 202.

Then, the silicon is etched anisotropically to form the hollow structure. Tetramethyl ammonium hydroxide (TMAH) or other chemical is used as an etchant for the anisotropic etching of the single-crystal silicon. Thus, a hollow structure 7 is formed inside the single-crystal silicon support substrate 6 (FIG. 12C).

Finally, the silicon oxide film 201 is etched to expose the bonding pad. At this time, a liquid mixture of acetic acid and ammonium fluoride is preferably used as the etchant for enhancing the selectivity ratio of the bonding pad 17 vs. aluminum.

During etching of the protective oxide film 201, the silicon oxide films 201, 18, 11, and 8 forming the support structures are also etched. However, the silicon nitride film 15 is not etched. A cross-sectional shape as shown in FIG. 12D is obtained. A plan view and a cross section of infrared detection pixels under this condition are shown in FIG. 3.

At this time, the front and side surfaces of the metal silicide layer 103 that show a low chemical resistance against ammonium fluoride are protected by the silicon nitride film 15. The bottom surface is protected by the polysilicon 101. Therefore, the support conductive interconnects remain unetched.

With the present structure, the width of the support structures can be decreased beyond the limitations of miniaturization of lithography. Because the cross-sectional area can be reduced, the sensitivity can be enhanced. Simultaneously, ultrafine machining is possible since the support structures are formed in the same layer as the gate electrodes of the MOS transistors. This also enhances the sensitivity.

Furthermore, use of a low-resistivity material such as polycide or polymetal can suppress thermal noise due to the electrical resistivity of the support conductive interconnects. The low-resistivity material enhances the sensitivity.

Besides, the same effects as produced by the first embodiment can be produced.

FOURTH EMBODIMENT

A fourth embodiment of the present invention is next described.

FIGS. 11A–13 are views illustrating steps for fabricating the infrared sensor in accordance with the fourth embodiment of the invention. Cross-sectional structures of MOS transistors in the peripheral circuitry and of support structures are also shown in the same way as in FIGS. 4 and 5. A bonding pad is formed in a conductive interconnect layer located immediately over the source/drain regions. Of course, other structures may also be adopted.

In the present embodiment, only one layer of metallization, or conductive interconnect, 17 is formed as shown in FIGS. 11A–13. Of course, multilayer metallization may also be formed, and the top metallization layer may be used as a bonding pad.

Figure 13:
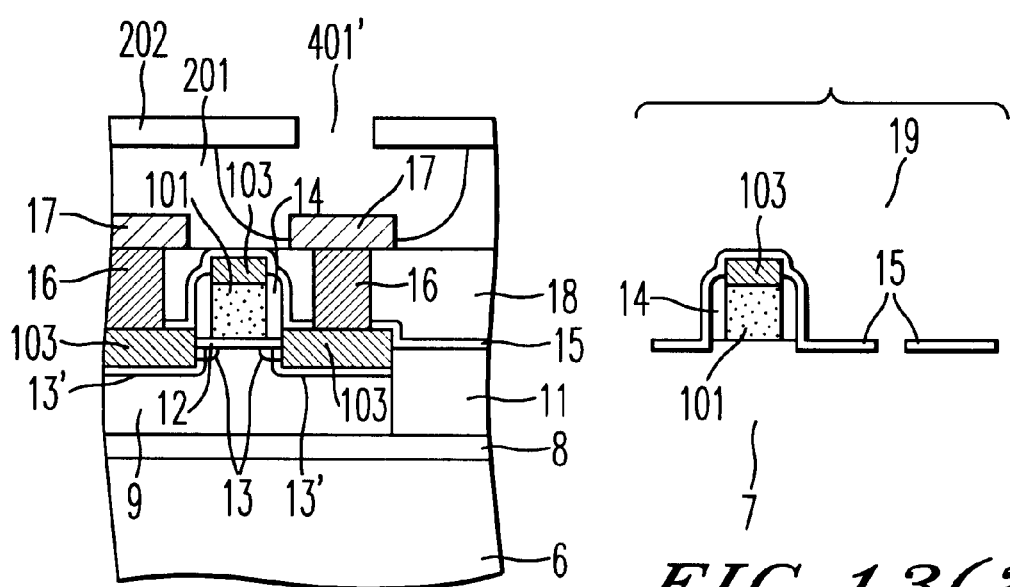
FIG. 13 is a cross-sectional view illustrating process steps following the steps illustrated in FIGS. 12C–12D.

In the present embodiment, process steps of FIGS. 11A–12D are exactly identical with their counterparts of the first embodiment described previously. Therefore, description of these steps is omitted. The final structure of the third embodiment is shown in FIG. 12D. By etching the silicon oxide film further, a structure as shown in FIG. 13 is obtained.

In the bonding pad opening 401, side etching of the silicon oxide film 201 progresses, and an overhanging profile of the silicon nitride film 202 appears. It is to be noted, however, that the conductive interconnects 17 located immediately over the source/drain regions of the MOS transistors are shown as a bonding pad for the sake of convenience. Therefore, the overhanging profile is exaggerated compared to the actual geometry. It can be sufficiently neglected in comparison with the actual dimensions of the bonding pad and is within a tolerable range.

On the other hand, with respect to the support structure, the silicon oxide films 201, 18, 11, and 8 that formed the support dielectric layer have been fully etched. Only the support conductive interconnect 101, 103 of the polycide structure and the silicon nitride films 14, 15 for protecting the interconnects are left behind. This geometry is accomplished by the cross-sectional structure in which the metal silicide layer 103 is completely protected by the silicon nitride films 14, 15 and the polysilicon 101.

The pixel structure under this condition is shown in FIG. 10. As can be seen from this figure, the cross-sectional area of the support structures has been reduced. This leads to a decrease in the thermal transfer through the support structures, which in turn results in improved sensitivity.

With the present structure, the width of the support structures can be decreased beyond the limitations of miniaturization of lithography. The thermal conduction through the support structures is reduced to a level where the conduction is dominated substantially only by the support conductive interconnects. Because the cross-sectional area is reduced, the sensitivity is enhanced. Simultaneously, ultrafine machining is possible since the support structures are formed in the same layer as the gate electrodes of the MOS transistors. The ultrafine machining enhances the sensitivity.

Furthermore, use of a low-resistivity material such as polycide or polymetal can suppress thermal noise due to the electrical resistivity of the support conductive interconnects. Consequencely, the sensitivity is enhanced.

Besides, the same effects as produced by the first embodiment can be produced.

FIFTH AND SIXTH EMBODIMENTS

Infrared sensors in accordance with fifth and sixth embodiments, respectively, of the present invention are next described.

Figure 14A:
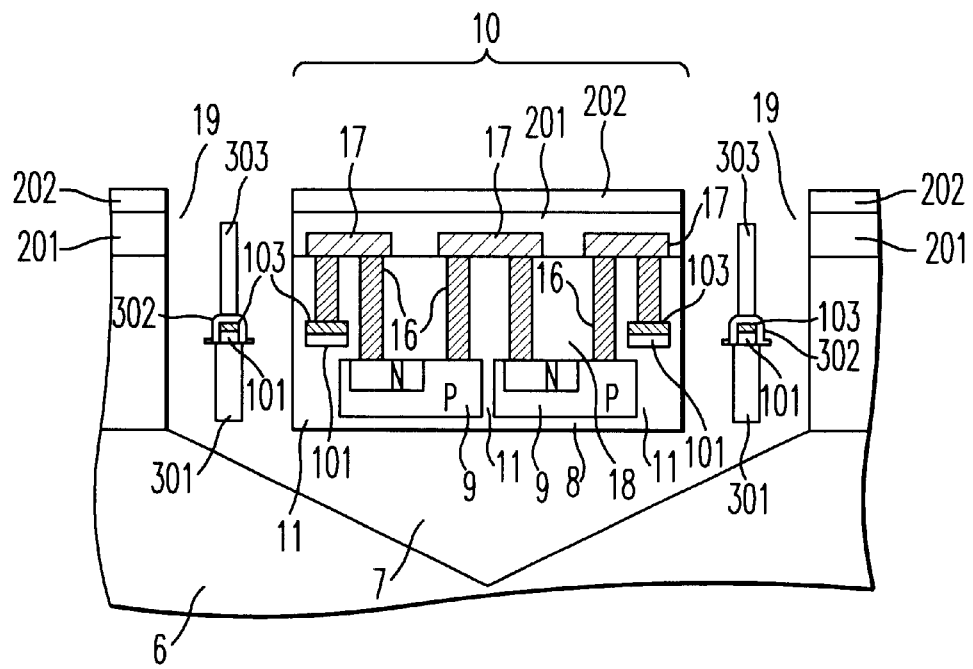
FIGS. 14A–14B are views showing the cross-sectional structure and the two-dimensional structure of infrared detection pixels of an infrared sensor in accordance with a fifth embodiment of the invention.
Figure 14B:
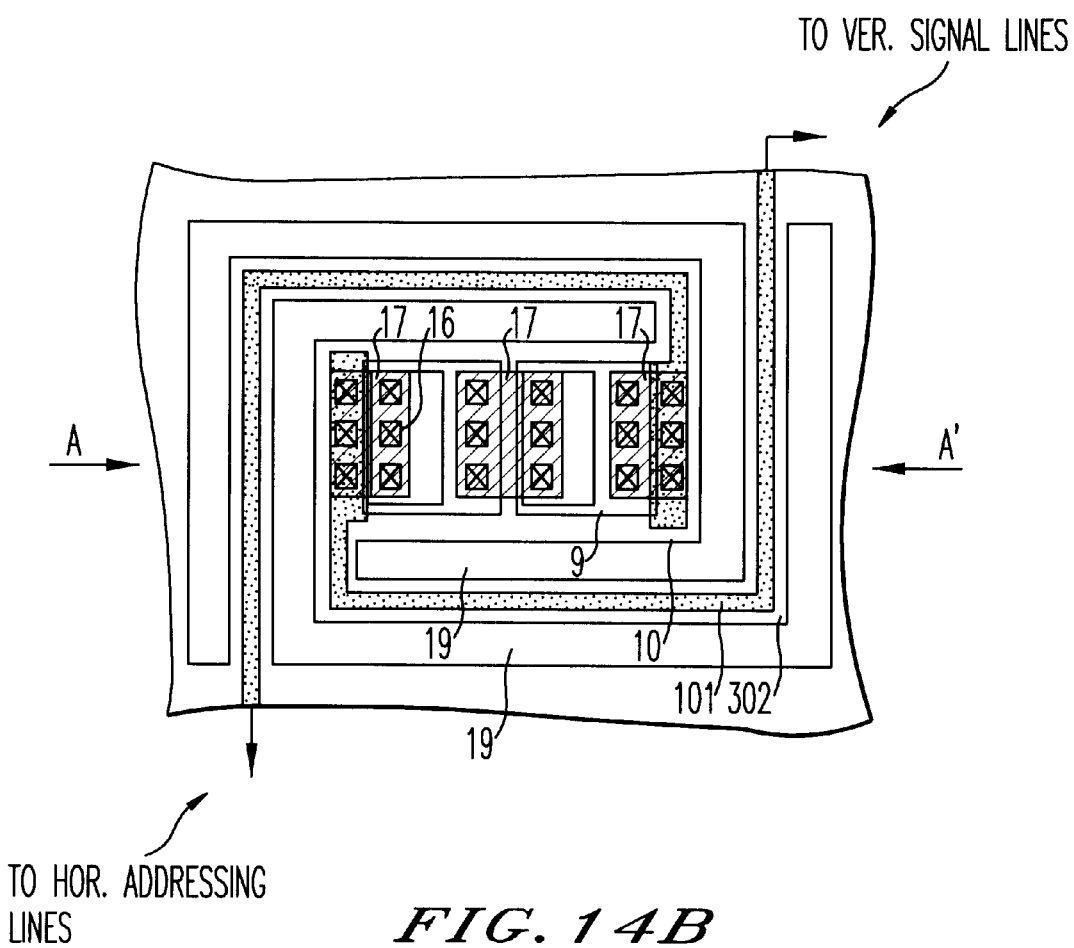

FIGS. 14A–14B is a view showing the cross-sectional structure and two-dimensional structure of pixels portions of an infrared sensor in accordance with a fifth embodiment of the invention.

FIG. 14A shows a cross-sectional structure that is similar to the first embodiment shown in FIG. 3 except that the buried oxide film 8 in the SOI substrate does not exist at the bottom of the infrared sensor 10 but the SOI layer 9 is in direct contact with the hollow structure 7 and exposed.

In this structure, thermal transportation owing to radiation from the rear surface of the sensor portion 10 is suppressed. Limitation on improvement of the sensitivity caused by miniaturization of support structures can be shifted toward the higher-sensitivity side, for the following reason.

With the prior art structure of FIG. 22 and with the structure of FIG. 3, a silicon oxide film or silicon nitride film is always formed on the bottom surface of the sensor portion. As described already, the silicon oxide film and silicon nitride film exhibit absorption in the 10 $\mu$m-band attributable to the presence of Si—O bond and Si—N bond as shown in FIGS. 6A–6C. When viewed from the opposite perspective, the emissivity in the 10 $\mu$m-band is high. It follows that the temperature of the sensor portion 10 elevated by incident infrared radiation is lowered by heat transportation caused by radiation from the silicon oxide film and silicon nitride film on the bottom surface.

Because the support structures are reduced in size, the achieved thermal conductance of the support structures is approximately $10^{-7}$ [W/m/K]. When the thermal conductance reaches about $10^{-8}$ [W/m/K] as a result of the forthcoming trend toward miniaturization, it is expected that heat transportation owing to radiation from the rear surfaces will be prevalent and that further sensitivity improvement will be limited.

On the other hand, in the structure of FIG. 14A and FIG. 14B indicating the present embodiment, the single-crystal silicon 9 is exposed at most of the rear surface of the sensor portion 10. Since the dopant concentration of single-crystal silicon is quite low, infrared absorption peaks attributed to Si—O and Si—N are not exhibited. Accordingly, the emissivity is quite low.

That is, in the present embodiment, limitation on improvement of the sensitivity caused by miniaturization of support structures can be shifted toward the higher-sensitivity side.

A sixth embodiment of the present embodiment is next described.

Figure 15A:
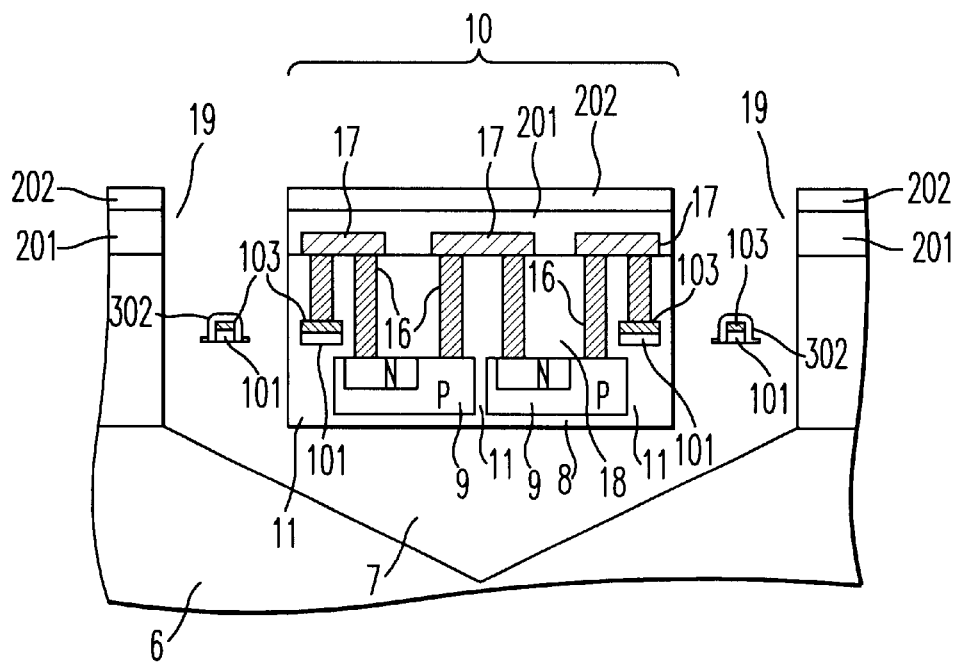
FIGS. 15A–15B are views showing the cross-sectional structure and the two-dimensional structure of infrared detection pixels of an infrared sensor in accordance with a sixth embodiment of the invention.
Figure 15B:
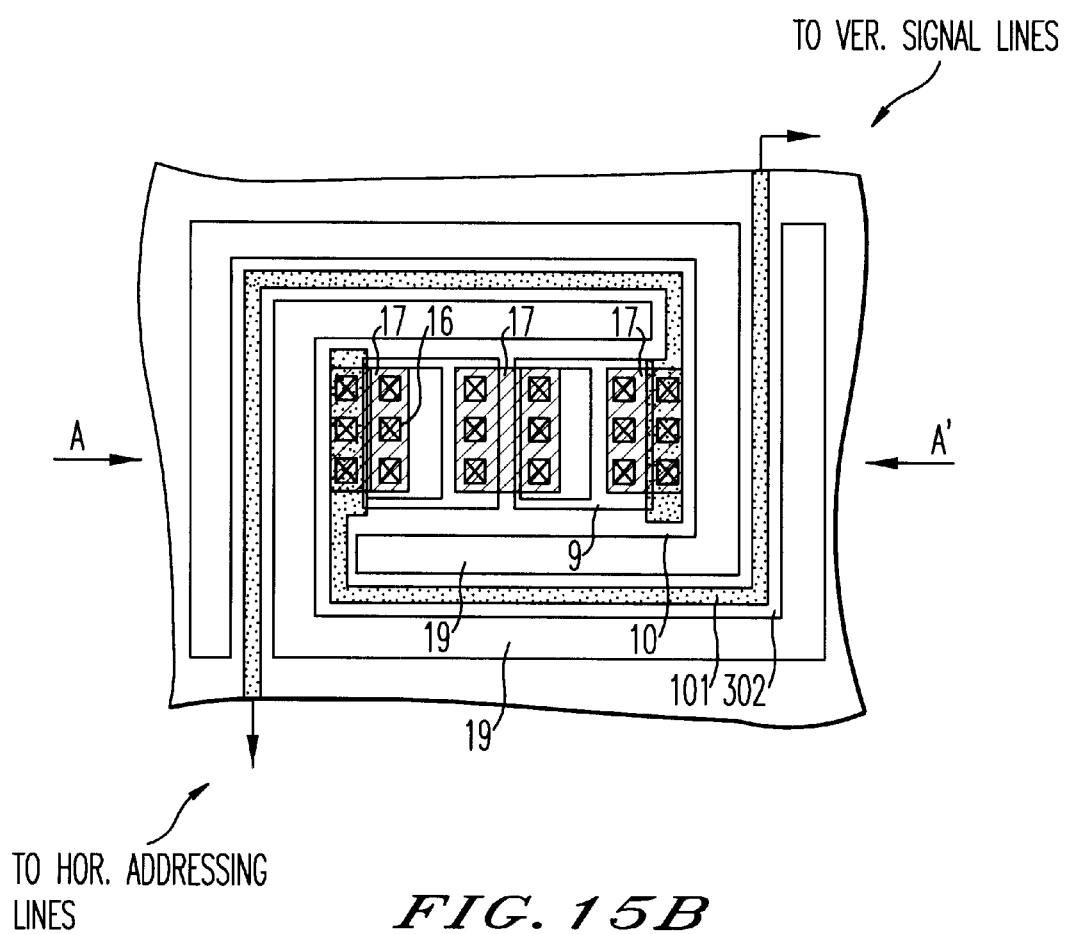

FIGS. 15A–15B shows the cross-sectional structure and the two-dimensional structure of the pixel portions of an infrared sensor in accordance with the sixth embodiment of the present invention.

FIG. 15A shows a cross-sectional structure that is similar to the first embodiment shown in FIG. 10 except that the buried oxide film 8 in the SOI substrate does not exist at the bottom of the infrared sensor portion 10 but the SOI layer 9 is in direct contact with the hollow structure 7 and exposed.

Alternatively, the cross-sectional structure is similar to the fifth embodiment shown in FIG. 14A except that the support dielectric layer protecting the support conductive interconnects forming the support structures consists only of the silicon nitride film 302, and that the polysilicon 101 on the bottom surface of the support conductive interconnects is exposed.

According to the present embodiment, the thermal conductance of the support structures is quite low. At the same time, heat transportation owing to radiation from the rear surface of the sensor portion is reduced.

Consequently, the present embodiment makes it possible to obtain an infrared sensor of high sensitivity.

A method of fabricating infrared sensors in accordance with the fifth and sixth embodiments of the present invention is illustrated in FIGS. 16A–18F. Since the steps of FIGS. 16A–18F are fundamentally identical with the above-described steps of FIGS. 7A–9F, their description is omitted. As can be seen from comparison between FIGS. 16A and 7A, the present embodiment shown in FIG. 16A uses an SOI substrate having a thin buried oxide film 8. Therefore, as shown in FIG. 18E or 18F that indicates the final structure, the buried oxide film 8 does not exist on the bottom surfaces of the support structures. Although not shown in the figure, the single-crystal silicon layer 9 is exposed at the bottom surface of the sensor portion 10.

The structure of FIG. 14A and FIG. 14B is obtained by the process steps up to the step of FIG. 18E. The structure of FIG. 15A and FIG. 15B is obtained by the process steps up to the step of FIG. 18F.

SEVENTH AND EIGHTH EMBODIMENTS

A method of fabricating infrared sensors in accordance with seventh and eighth embodiments of the present invention is illustrated in FIGS. 19A–21. Since the process steps of FIGS. 19A–21 are fundamentally the same as the aforementioned steps of FIGS. 11A–13, their description is omitted. As can be seen by comparing FIGS. 19A and 11A, the present embodiment shown in FIG. 19A uses an SOI substrate having a thin buried oxide film 8. Therefore, as shown in FIG. 20D or 21 that indicates the final structure, the buried oxide film 8 does not exist on the bottom surfaces of the support structures. Although not shown in the figure, the single-crystal silicon layer 9 is exposed at the bottom surface of the sensor portion 10.

The structure of FIG. 14A and FIG. 14B is obtained by the process steps up to the step of FIG. 20D. The structure of FIG. 15A and FIG. 15B is obtained by the process steps up to the step of FIG. 21.

It is to be noted that the present invention is not limited to the embodiments described above. For example, in any embodiment described thus far, the infrared sensor includes infrared detection pixels arrayed in two dimensions. Of course, similar effects can be produced if the invention is applied to a one-dimensional sensor in which infrared detection pixels are arrayed in one dimension or to an infrared sensor comprising a single infrared detection pixel (i.e., there is no array).

In the present embodiment, gate electrodes and support conductive interconnects are formed by a polycide structure. A polymetal structure enabling a further decrease in resistivity can also be adopted. Thermal noise due to the electrical resistivity of the support conductive interconnects can be decreased. The sensitivity is enhanced.

In this case, as a laminate structure including a gate electrode and support conductive interconnects, a titanium nitride film acting as a barrier metal and a tungsten film for reducing the resistivity can be stacked on the polysilicon layer 101 instead of the metal silicide layer 103.

Figure 23:
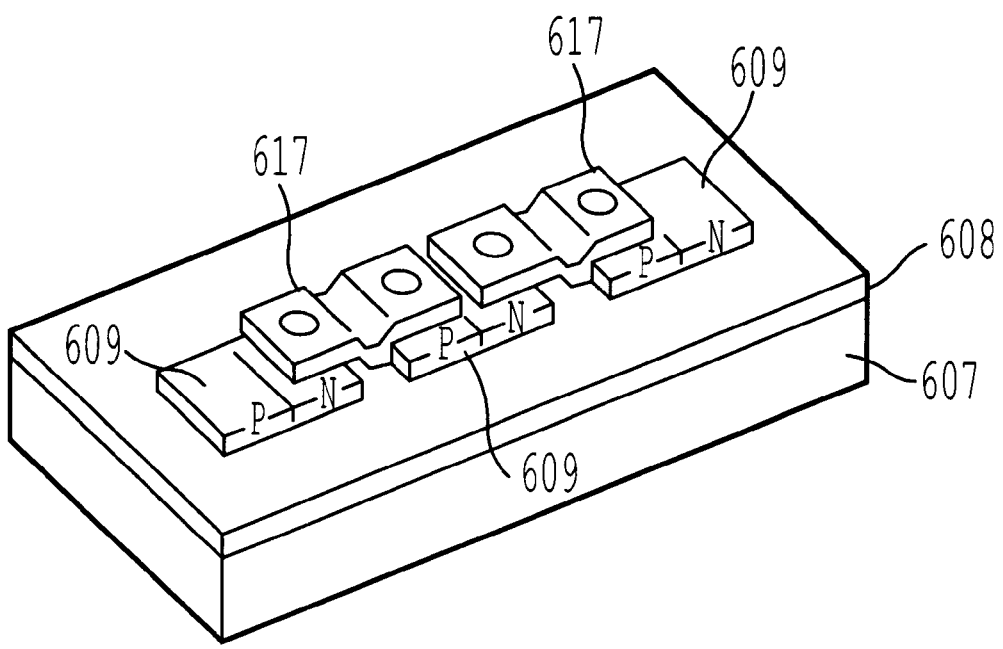
FIG. 23 is a perspective view illustrating the structure of infrared detection pixels using lateral pn junctions.

In the present invention, the pn junction used as a thermoelectric conversion mechanism is not limited to a pn junction of a planar structure. Where a pn junction of lateral structure as shown in FIG. 23 is used as a thermoelectric conversion mechanism, the invention can also be practiced.

In addition, the present invention is not restricted to devices using thermoelectric conversion mechanisms including of pn junctions. For example, if a low-resistivity polycide structure or polymetal structure is used as the gate material of MOS transistors in the sensor device periphery circuitry, and if a bolometer is fabricated from the same layer as the polycide or polymetal structure, the effects of higher sensitivity and cost saving owing to the micromachining and process step reduction can be produced.

Besides, various changes and modifications are possible within the scope of the subject matter of the present invention.

In accordance with the present invention, a low-cost, high-sensitivity, uncooled infrared sensor can be obtained.

What is claimed is:

1. A method of fabricating an infrared sensor having a plurality of infrared detection pixels on a substrate, each of said infrared detection pixels including an infrared absorption portion configured to absorb infrared radiation and a thermoelectric converter portion configured to convert a temperature in said infrared absorption portion into an electrical signal, said method comprising:

forming said thermoelectric converter portion on said substrate;

forming a conductive film on said substrate;

patterning said conductive film to form first conductive film patterns in first areas where said infrared detection pixels should be formed and to form second conductive film patterns in second areas other than said first areas;

etching portions of said substrate under said thermoelectric converter portions and said first conductive film patterns to form support structures configured to support said thermoelectric converter portions over said substrate via a separation space, said support structures having said first conductive film patterns as conductive interconnect layers configured to carry said electrical signal from said infrared detection pixels;

forming MOS transistors having gate layers comprising said second conductive film patterns;

forming a pixel-selecting circuit configured to select at least one of said infrared detection pixels, said pixel-selecting circuit comprising at least one of said MOS transistors; and forming an output circuit configured to output said electrical signal delivered from selected infrared detection pixels via said conductive interconnect layers, said output circuit comprising at least one of said MOS transistors.

2. The method of fabricating an infrared sensor according to claim 1, wherein said step of forming a conductive film comprises:

forming a laminate structure including a polysilicon layer and a metal silicide layer, wherein each of the conductive interconnect layers and said gate layers has said laminate structure.

3. The method of fabricating an infrared sensor according to claim 1, wherein said step of forming a conductive film comprises:

forming a laminate structure including a polysilicon layer and a metal layer, wherein each of the conductive interconnect layers and said gate layers has said laminate structure.

4. The method of fabricating an infrared sensor according to claim 1, further comprising:

forming first dielectric layers on side and top surfaces of gate layers of said MOS transistors; and forming second dielectric layers to cover side and top surfaces of said conductive interconnect layers, wherein said first and second dielectric layers are formed by patterning a dielectric film.

5. A method of fabricating an infrared sensor having a plurality of infrared detection pixels on a substrate, each of said infrared detection pixels including an infrared absorption portion configured to absorb infrared radiation and a thermoelectric converter portion configured to convert a temperature change in said infrared absorption portion into an electrical signal, said method comprising:

forming first conductive film patterns on first areas where said infrared detection pixels should be formed;

forming second conductive film patterns on second areas other than said first areas;

forming first dielectric layers to cover side and top surfaces of each of said first and second conductive film patterns;

etching portions of said substrate under said thermoelectric converter portions and said first conductive film patterns to form support structures configured to support said thermoelectric converter portions over said substrate via a separation space, said support structures having said first conductive film patterns as conductive interconnect layers configured to deliver said electrical signal from said infrared detection pixels;

forming MOS transistors having gate layers comprising said second conductive film patterns and said first dielectric layers;

forming a pixel-selecting circuit configured to select at least one of said infrared detection pixels which delivers the electrical signal, said pixel-selecting circuit comprising at least one of said MOS transistors; and forming an output circuit configured to output said electrical signal delivered from selected infrared detection pixels via said conductive interconnect layers, said output circuit comprising at least one of said MOS transistors.

6. The method of fabricating an infrared sensor according to claim 5, wherein said first dielectric layers include silicon nitride.

7. A method of fabricating an infrared sensor having a plurality of infrared detection pixels on a substrate, each of said infrared detection pixels including an infrared absorption portion configured to absorb infrared radiation and a thermoelectric converter portion configured to convert a temperature change in said infrared absorption portion into an electrical signal, said method comprising:

forming recessed portions in areas of said substrate where said infrared detection pixels should be formed;

forming isolation dielectric layers in said recessed portions;

forming first conductive film patterns on said isolation dielectric layers;

forming first dielectric layers to cover side and top surfaces of said first conductive film patterns;

forming a second dielectric layer on said first dielectric layers;

etching portions of said substrate under said thermoelectric converter portions and said first conductive film patterns to form support structures configured to support said thermoelectric converter portions over said substrate via a separation space, said support structures having said first conductive film patterns as conductive interconnect layers configured to deliver said electrical signal from said infrared detection pixels;

selectively etching said isolation dielectric layers and said second dielectric layer relative to said first dielectric layers to at least one of remove at least one of said isolation dielectric layers and portions of said second dielectric layer on said first dielectric layers and make widths of said second dielectric layer smaller than widths of said first dielectric layers;

forming a pixel-selecting circuit configured to select at least one of said infrared detection pixels which delivers the electrical signal, said pixel-selecting circuit comprising at least one of said MOS transistors; and forming an output circuit configured to output said electrical signal delivered from selected infrared detection pixels via said conductive interconnect layers, said output circuit comprising at least one of said MOS transistors.

8. The method of fabricating an infrared sensor according to claim 7, wherein said first dielectric layers include silicon nitride, and said second dielectric layers include silicon oxide.

* * * * *